US012812769B2

(12) United States Patent
Goergen et al.

(10) Patent No.: US 12,812,769 B2
(45) Date of Patent: Nov. 24, 2026

(54) LAYOUT ARRANGEMENTS FOR PLUGGABLE OPTICS IN NETWORKING EQUIPMENT TO ACHIEVE SHORT ELECTRICAL SIGNAL TRACES

(71) Applicant: Cisco Technology, Inc., San Jose, CA (US)

(72) Inventors: Joel Richard Goergen, Soulsbyville, CA (US); Giovanni Giobbio, Rovellasca (IT); Krishnagopal Goswami, Bangalore (IN); Prashanth Pavithran, Bangalore (IN); Marco Croci, Vimercate (IT); Meir Peleg, Caesarea (IL); Vic Hong Chia, Sunnyvale, CA (US); Hua Yang, Tracy, CA (US); Mete Yilmaz, Milpitas, CA (US); Xin Mao, Milpitas, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 339 days.

(21) Appl. No.: 18/434,252

(22) Filed: Feb. 6, 2024

(65) Prior Publication Data

US 2025/0147256 A1 May 8, 2025

Related U.S. Application Data

(60) Provisional application No. 63/597,022, filed on Nov. 8, 2023.

(51) Int. Cl.

| | |
|---|---|
| ***H05K 1/02*** | (2006.01) |
| ***G02B 6/44*** | (2006.01) |
| ***H04Q 1/02*** | (2006.01) |

(52) U.S. Cl.
CPC ......... *H05K 1/0274* (2013.01); *G02B 6/4453* (2013.01); *H04Q 1/03* (2013.01); *H05K 1/0203* (2013.01); *H05K 2201/10121* (2013.01)

(58) Field of Classification Search
None
See application file for complete search history.

(56) References Cited

U.S. PATENT DOCUMENTS

| | | | | |
|---|---|---|---|---|
| 9,794,195 B1 | 10/2017 | Wilson et al. | | |
| 10,884,204 B2 * | 1/2021 | Iwama | ................ | G02B 6/4268 |

(Continued)

FOREIGN PATENT DOCUMENTS

| | | |
|---|---|---|
| EP | 3322197 A1 | 5/2018 |

OTHER PUBLICATIONS

International Search Report and Written Opinion for International Application No. PCT/US2024/054039, mailed Feb. 28, 2025, 9 pages.

(Continued)

*Primary Examiner* — Courtney L Smith
(74) *Attorney, Agent, or Firm* — Edell, Shapiro & Finnan, LLC

(57) ABSTRACT

A device is provided that includes a printed circuit board and an integrated circuit that is installed on the printed circuit board. A plurality of optical transceiver modules are positioned on the printed circuit board around three or more sides of the integrated circuit. The plurality of optical transceiver modules are to be in operable communication with the integrated circuit. A faceplate is installed that has multiple face portions that expose receptacles for the plurality of optical transceiver modules around the integrated circuit.

20 Claims, 21 Drawing Sheets

(56) References Cited

U.S. PATENT DOCUMENTS

| | | | | |
|---|---|---|---|---|
| 12,389,527 | B2 | 8/2025 | Rivaud et al. | |
| 12,419,010 | B2 | 9/2025 | Shearman et al. | |
| 12,455,423 | B2 * | 10/2025 | Nagarajan | G02B 6/43 |
| 2003/0185536 | A1 | 10/2003 | Steinman et al. | |
| 2021/0409846 | A1 * | 12/2021 | Leigh | G02B 6/3562 |
| 2022/0078532 | A1 * | 3/2022 | Shearman | H05K 1/00 |
| 2023/0067157 | A1 | 3/2023 | Minota | |
| 2023/0088207 | A1 | 3/2023 | Shearman et al. | |
| 2024/0179877 | A1 * | 5/2024 | Rivaud | H05K 7/2039 |
| 2025/0063679 | A1 | 2/2025 | Shearman et al. | |
| 2026/0013069 | A1 | 1/2026 | Frankel et al. | |

OTHER PUBLICATIONS

Dobbelaere, P.D., et al., "Silicon Photonics Technology Platform for Integration of Optical IOs with ASICs", Luxtera, Aug. 26, 2013, 18 pages.

Duan, P., "A Novel 3D Stacking Approach for Chip-to-chip Interconnects", Electro-Optical Communication, Eindhoven University of Technology, Nov. 19, 2014, 160 Pages.

Yeluri, S., "Silicon Photonics and Integrated Optics", Juniper Networks, Oct. 27, 2022, 14 Pages.

* cited by examiner

LAYOUT ARRANGEMENTS FOR PLUGGABLE OPTICS IN NETWORKING EQUIPMENT TO ACHIEVE SHORT ELECTRICAL SIGNAL TRACES

CROSS REFERENCE TO RELATED APPLICATION

This application claims priority to U.S. Provisional Application No. 63/597,022, filed Nov. 8, 2023, the entirety of which is incorporated herein by reference.

TECHNICAL FIELD

The present disclosure relates to networking equipment.

BACKGROUND

Since the early days of networking equipment, network devices have had optical or copper ports that extend to a faceplate on the front of the network device. The network devices may include optics/optical cages with retimers that connect to an application specific integrated circuit (ASIC). This configuration draws significant amounts of power and has extended length electrical signals between the optics and the ASIC that may barely meet signal integrity requirements.

DETAILED DESCRIPTION

Overview

Figure 1:
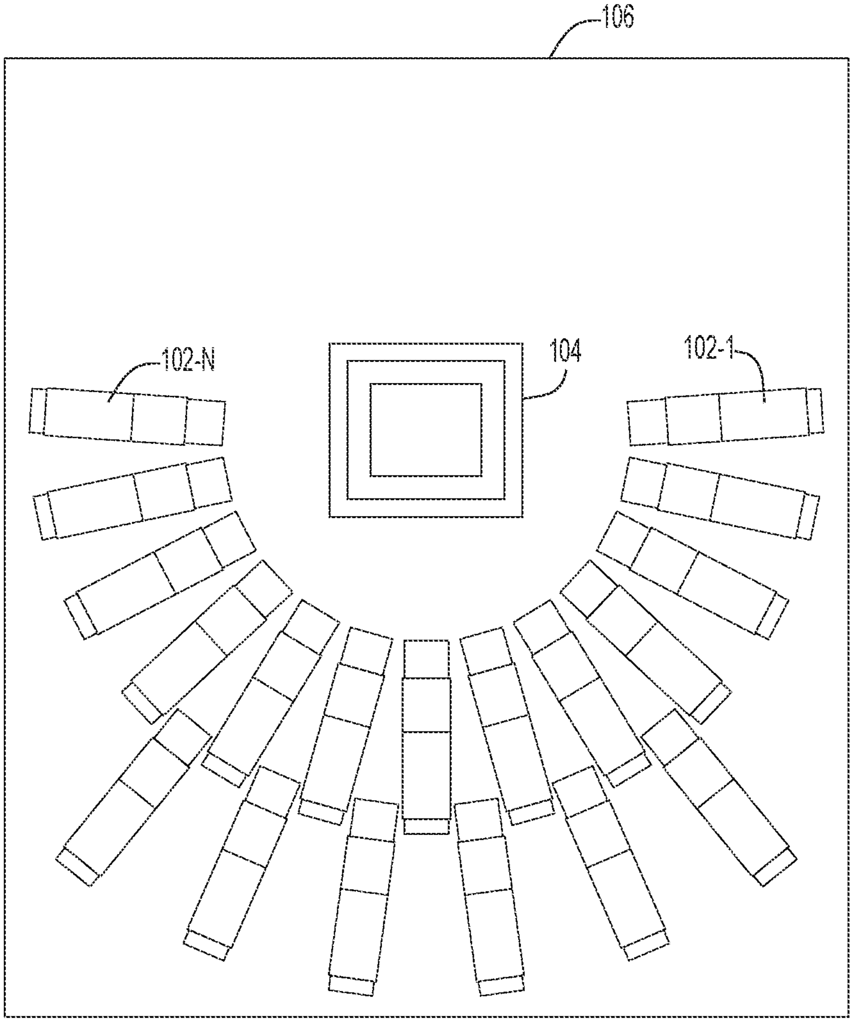
FIG. 1 illustrates a top view of an optical module layout in a semi-circular pattern around an ASIC, according to an example embodiment.

In one embodiment, a device is provided. The device includes a printed circuit board and an integrated circuit that is installed on the printed circuit board. The device additionally includes a plurality of optical transceiver modules positioned on the printed circuit board around three or more sides of the integrated circuit. The plurality of optical transceiver modules are to be in operable communication with the integrated circuit. The device additionally includes a faceplate that has multiple face portions that expose receptacles for the plurality of optical transceiver modules around the integrated circuit.

In another embodiment, a method is provided. The method includes installing an integrated circuit on a printed circuit board and positioning a plurality of optical transceiver modules on the printed circuit board around three or more sides of the integrated circuit. The plurality of optical transceiver modules are to be in operable communication with the integrated circuit. A faceplate that has multiple face portions that expose receptacles for the plurality of optical transceiver modules is installed around the integrated circuit.

In yet another embodiment, a device is provided. The device includes an integrated circuit that is installed on a printed circuit board and a plurality of optical transceiver modules positioned on the printed circuit board around three or more sides of the integrated circuit. The plurality of optical transceiver modules are in operable communication with the integrated circuit. The device includes a non-linear faceplate installed around outer edges of the plurality of optical transceiver modules around the integrated circuit. The non-linear faceplate includes openings for receptacles for the plurality of optical transceiver modules.

Example Embodiments

Traditionally, in devices that utilize pluggable optical modules, the optical modules are located along a front panel of the device and each of the optical modules is connected to an integrated circuit/ASIC in the device. Typically, the routing distances for the high speed signaling between the optical modules and the ASIC in this configuration are long. For high speed signaling, retimers and higher power serializer/deserializer (serdes) are needed to drive the longer trace lengths (e.g., trace lengths that are larger than 4-5 inches). A retimer is a serializer-deserializer buffer that resets the clock and data recovery for the signaling. The retimer takes up additional space on the circuit board and the higher power ASIC serdes and optical serdes require additional power to drive more power. Therefore, more power is required to operate the device and the device generates more heat that has to be cooled.

It is beneficial for power savings, circuit board space savings, system cooling reduction, optical operating temperature reduction, and more, to remove all retimers inside optical or ASIC components, as well as outside those components, and to cut transmitter and receiver serdes power. A new arrangement is presented herein for optical modules in network equipment that can significantly change high-speed routing requirements, allowing for differential signaling speeds exceeding 112 Gbps (G) and paving the way for 224G/448G signaling rates.

Presented herein is an optical module layout allowing for linear optics in traditional pluggable modules with significantly shorter trace lengths between optical modules and an integrated circuit or ASIC. The significantly shorter trace lengths reduce system power because there are no retimers or higher power serdes needed to drive the longer trace lengths. The optical module layout includes installing the optical modules on a printed circuit board (PCB) around the ASIC (e.g., in a semi-circular, circular, or diamond formation).

Techniques presented herein additionally allow for sliding the PCB out of a housing assembly for replacement of optical modules in a device while the device is active. Additionally, some embodiments presented herein provide for greater cooling of devices by utilizing a non-flat or non-linear faceplate with additional openings for cooling along the front and sides of the optical modules. Some embodiments described herein additionally allow for cooling of the devices using liquid cooling.

Some embodiments presented herein provide for powering the ASIC using a power plug attachment on the bottom of the PCB. Eliminating the retimers and higher power serdes and powering the ASIC using the power plug allow for a thinner printed circuit board with fewer layers, which drastically reduces a price associated with manufacturing the network devices.

Thus, present embodiments improve the technical field of network equipment by positioning optical transceiver modules around an integrated circuit to minimize a distance between each optical transceiver module and the integrated circuit and shorten trace lengths between the optical transceiver modules and the integrated circuit. Present embodiments therefore increase the efficiency of network equipment by eliminating a need for retimers or higher power serdes to drive longer trace lengths. Thus, present embodiments provide the practical application of a network device that requires less power to drive the network device. In addition, the present embodiments provide the practical application of increased cooling of a network device by installing a non-linear faceplate with multiple face portions that include openings for additional air inlet to cool the network device while minimizing fan usage. The present embodiments provide the additional practical application of providing a configuration of optical transceiver modules around an integrated circuit that can be cooled using liquid cooling solutions. Additionally, the present embodiments provide the practical application of installing the optical transceiver modules and the integrated circuit on a printed circuit that is placed on a chassis installed a rail that can slide out from a housing assembly so an optical transceiver module may be replaced when the network device is active.

Reference is first made to FIG. 1. FIG. 1 shows a layout of optical transceiver modules/optical modules 102-1 to 102-N (sometimes referred to herein singularly as optical module 102 or collectively as optical modules 102) in a semi-circular pattern around an ASIC 104 that may be implemented in a network device. The ASIC 104 and the optical modules 102 are installed on a printed circuit board (PCB) 106. Although not illustrated in FIG. 1, each optical module 102 is connected to ASIC 104 by one or more differential pair traces. By installing the optical modules 102 in the semi-circular pattern around the ASIC 104 (e.g., around at least portions of three of the sides of the ASIC 104), the optical modules 102 are closer to the ASIC 104 than if the optical modules 102 were arranged in a straight line along a front of the network device. The semi-circular or circular arrangement of the optical modules 102 around the ASIC 104 allows for shorter electrical traces and the application of linear optic pluggable modules that are much lower power than traditional pluggable optics at 400G and higher electrical signaling rates.

The shorter trace lengths eliminate the need for retimers and higher power serdes. By eliminating retimers, a thickness of the PCB 106 may be significantly reduced. By changing the orientation of the optical modules 102 to at least partially surround the ASIC 104, the number of layers in the PCB 106 may be reduced drastically compared to in traditional configurations. For example, the number of layers of the PCB 106 needed for receive signals may be cut in half and the number of layers of the PCB 106 needed for transmit signals may additionally be cut in half. Therefore, configuring the optical modules 102 at least partially around the ASIC 104 provides significant cost savings by eliminating retimers and higher power serdes and by drastically reducing the thickness of PCB 106. In addition, the elimination of the retimers and higher power serdes reduces the heat produced by a network device, which saves power needed for network device cooling and reduces costs associated with the production of the network device.

Figure 2:
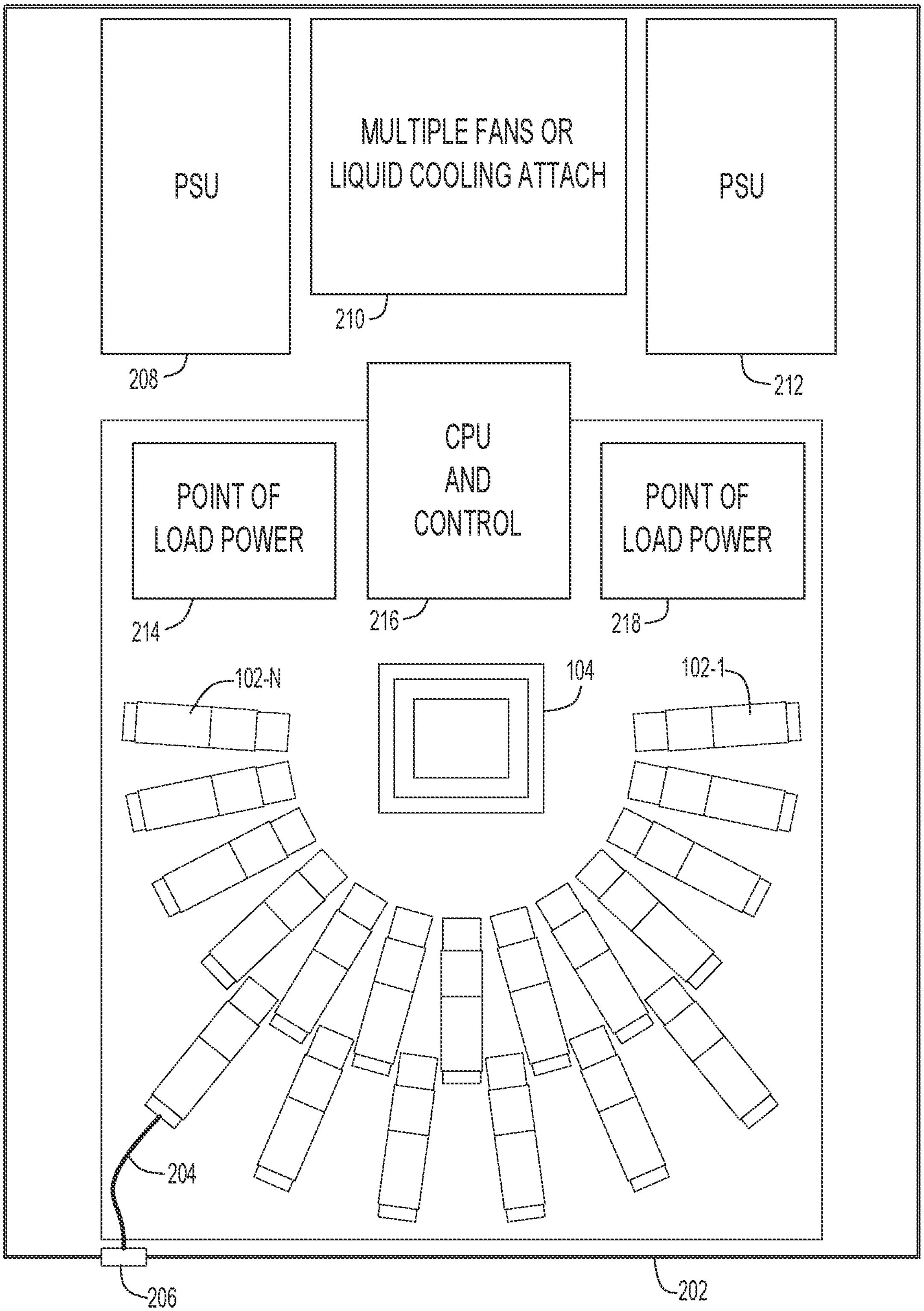
FIG. 2 illustrates a device component arrangement that uses the optical cage/module layout of FIG. 1, according to an example embodiment.

Reference is now made to FIG. 2. FIG. 2 shows a more complete arrangement of employing the optical module layout of FIG. 1, but with respect to other components of a network device and a chassis containing the optical modules. In particular, FIG. 2 illustrates a chassis 202 containing optical modules 102-1 to 102-N and other components of the network device. In the example illustrated in FIG. 2, the other components include power supply units (PSUs) 208 and 212, cooling equipment 210 (e.g., fans or a liquid cooling attachment), point of load (POL) power sources 214 and 218, and central processing unit (CPU) and control 216.

As illustrated in FIG. 2, an optical cable 204 connects each optical module 102 to a faceplate of the chassis 202 using an LC bulkhead connector 206. Although only one optical cable 204 and one LC bulkhead connector 206 is illustrated for simplicity, each optical module 102 may be connected to the faceplate using an optical cable 204 and an LC bulkhead connector 206. Using LC bulkhead connectors 206 provides more air flow when fans are used for cooling because the traditional front mount cages with higher power optical modules are not blocking the air at the entry.

The optical cages are inside the chassis 202 and are significantly closer to the ASIC 104 than in previous configurations. This allows for shorter electrical traces and the application of linear optic pluggable modules that are much lower power then traditional pluggable optics at 400G and higher electrical signaling rates. As discussed above with respect to FIG. 1, the configuration of the optical modules 102 around the ASIC 104 reduces the signal trace lengths. For example, the maximum trace length is 2.5 inches for the optical module cages in the inner ring and 4.5 inches for the optical module cages in the outer ring. In addition, for the configuration illustrated in FIG. 2, a PCB trace loss of 1 dB/inch or less may be achieved by using ultra-low loss PCB material.

Figure 3:
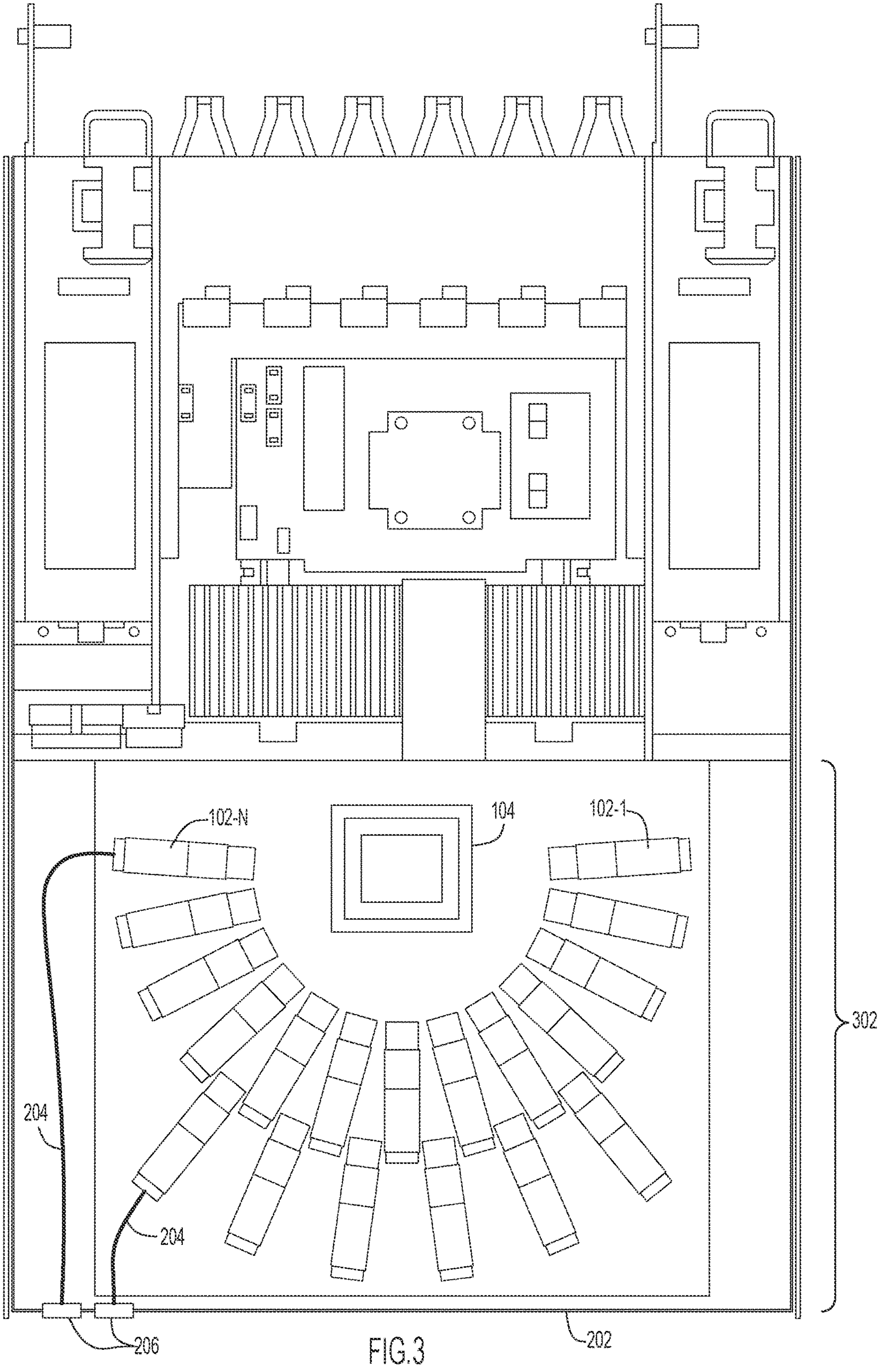
FIG. 3 illustrates a more detailed device arrangement that uses the optical cage/module layout of FIG. 1 and depicts a hinged top cover over the optical cage/module layout that lifts upwards, according to an example embodiment.

Reference is now made to FIG. 3. FIG. 3 shows yet another more detailed view of the arrangement of FIG. 2. In FIG. 3, the entire 1 rack unit (RU) or 2 RU chassis 202 including PCB 106 may slide out about 40-45% of the way forward. For example, the chassis 202 may be configured on a sliding rail in a housing assembly and the chassis 202 may slide forward out of the housing assembly to allow a user to access the components on the PCB 106. As shown at 302, the top may be lifted up and an optical module 102 may be replaced. According to embodiments described herein, an optical module 102 may be replaced regardless of whether the network device is powered off. In other words, an optical module 102 may be replaced while the network device is active. Similar to the example illustrated in FIG. 2, the optical modules 102 may connect to the faceplate bulkhead by means of an optical patch cable 204 that is low profile.

Figure 4A:
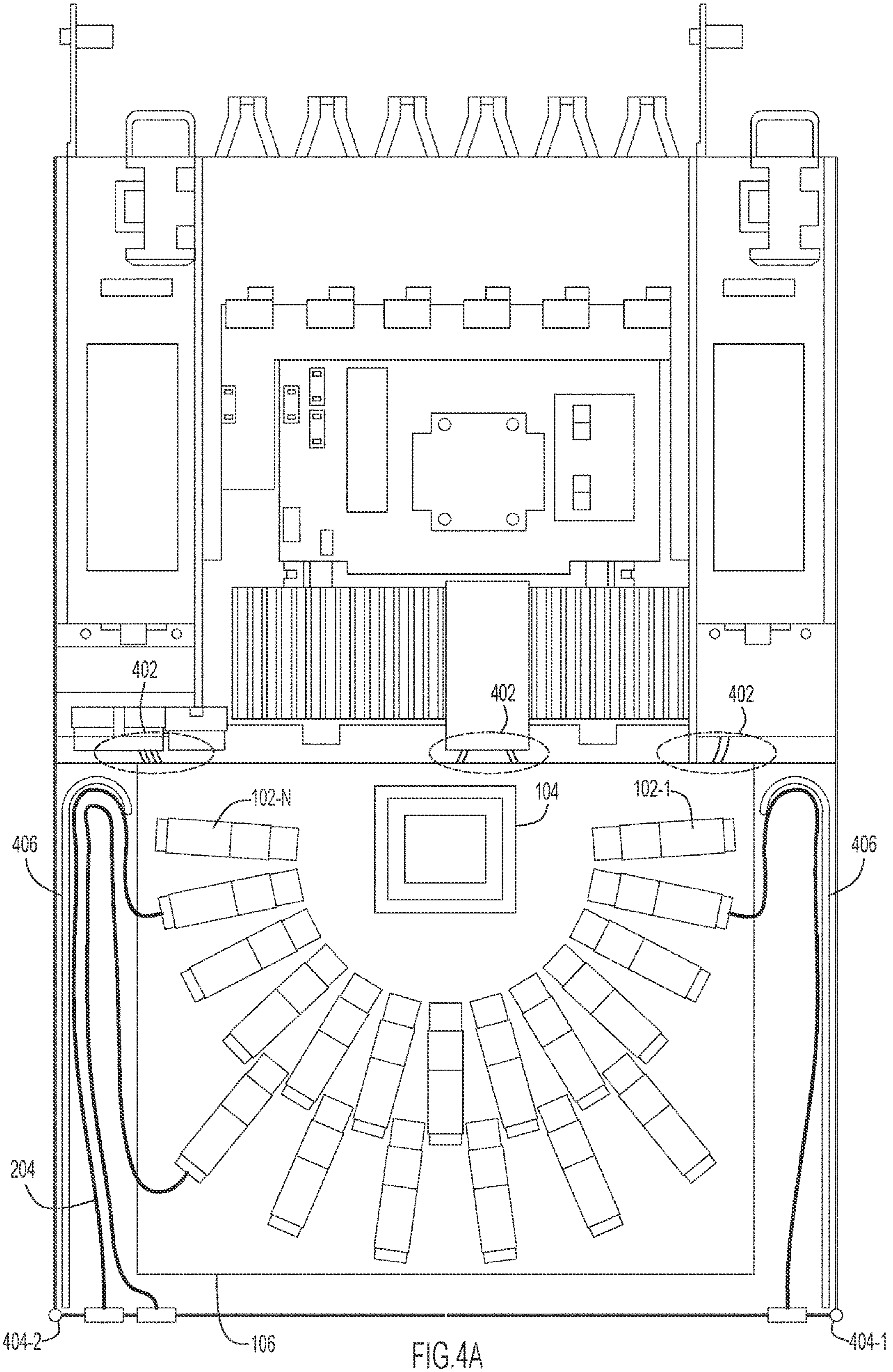
FIG. 4A illustrates a device arrangement similar to FIG. 3 and depicts a hinge panel on the front face that opens left and right, according to an example embodiment.

Reference is now made to FIG. 4A. FIG. 4A illustrates an example similar to the example illustrated in FIG. 3, but in which the 1RU chassis may be screwed into the rack mounts. As illustrated in FIG. 4A, the front faceplate has hinge points 404-1 and 404-2 that allow the faceplate to open to the left and to the right. When the faceplate is open, the PCB 106 with optical modules 102 and ASIC 104 assembly board may slide out. For example, the PCB 106 may be installed on a chassis that includes a sliding tray that is able slide forward out of a housing assembly to allow an optical module to be replaced or an optical cord to be installed. An optical patch cord flex management system 406 may allow the PCB 106 to slide out of the housing assembly without making a cable mess. Cabling 402 for power and control may provide power and control to the ASIC 104 and optical modules 102 when the PCB 106 is in the housing assembly or slid out from the housing assembly. A user may replace an optical module 102 (e.g., when the network device is active or inactive) and slide the PCB 106 back into the housing assembly.

Figure 4B:
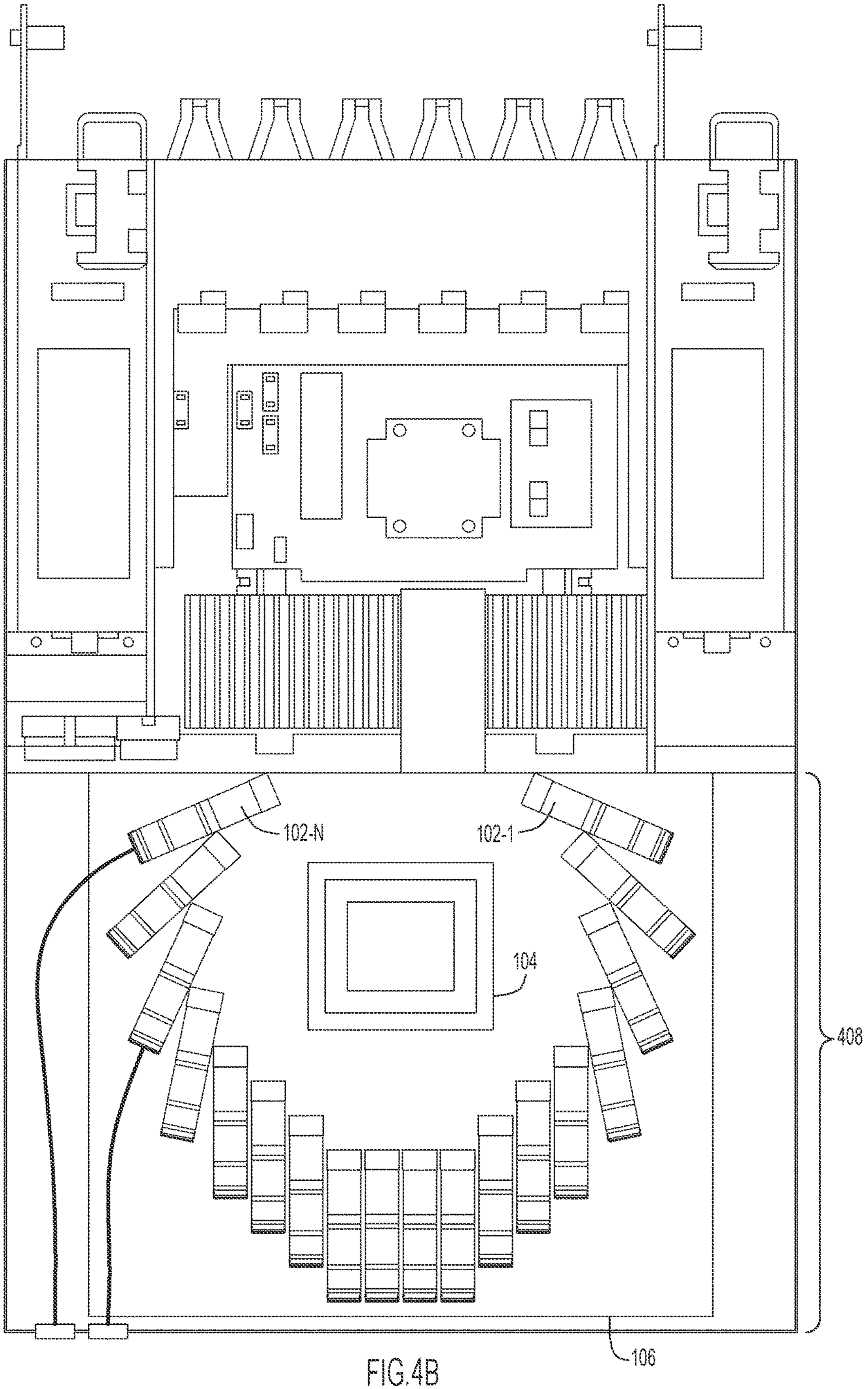
FIG. 4B illustrates a detailed device arrangement in which the optical cage/modules are in a pseudo-semi-circular arrangement, according to an example embodiment.

Reference is now made to FIG. 4B. FIG. 4B shows an example similar to the example illustrated in FIG. 4A, but in which the optical modules 102 are arranged in a pseudo-semi-circular arrangement. In the example illustrated in FIG. 4A, optical modules 102 are arranged in a single layer around three of the sides of ASIC 104. In this example, each of the optical modules 102 is approximately the same distance from ASIC 104. Therefore, each of the traces is approximately the same length. The configuration illustrated in FIG. 4B allows for short trace lengths that eliminate the need for retimers or higher power serdes. For example, the maximum trace length for the configuration illustrated in FIG. 4B is 3 inches. In addition, a PCB trace loss of 1 dB/inch may be achieved by using ultra-low loss PCB material.

FIG. 4B illustrates an example in which the PCB 106 with the optical modules 102 and ASIC 104 has been slid out of the assembly. The entire 1RU/2RU chassis may slide out about 40-45% of the way. As illustrated at 408, when the chassis slides out, the top cover may lift off for access to replace an optical module 102. The optical module 102 may be replaced when the network device is active or powered off.

Figure 4C:
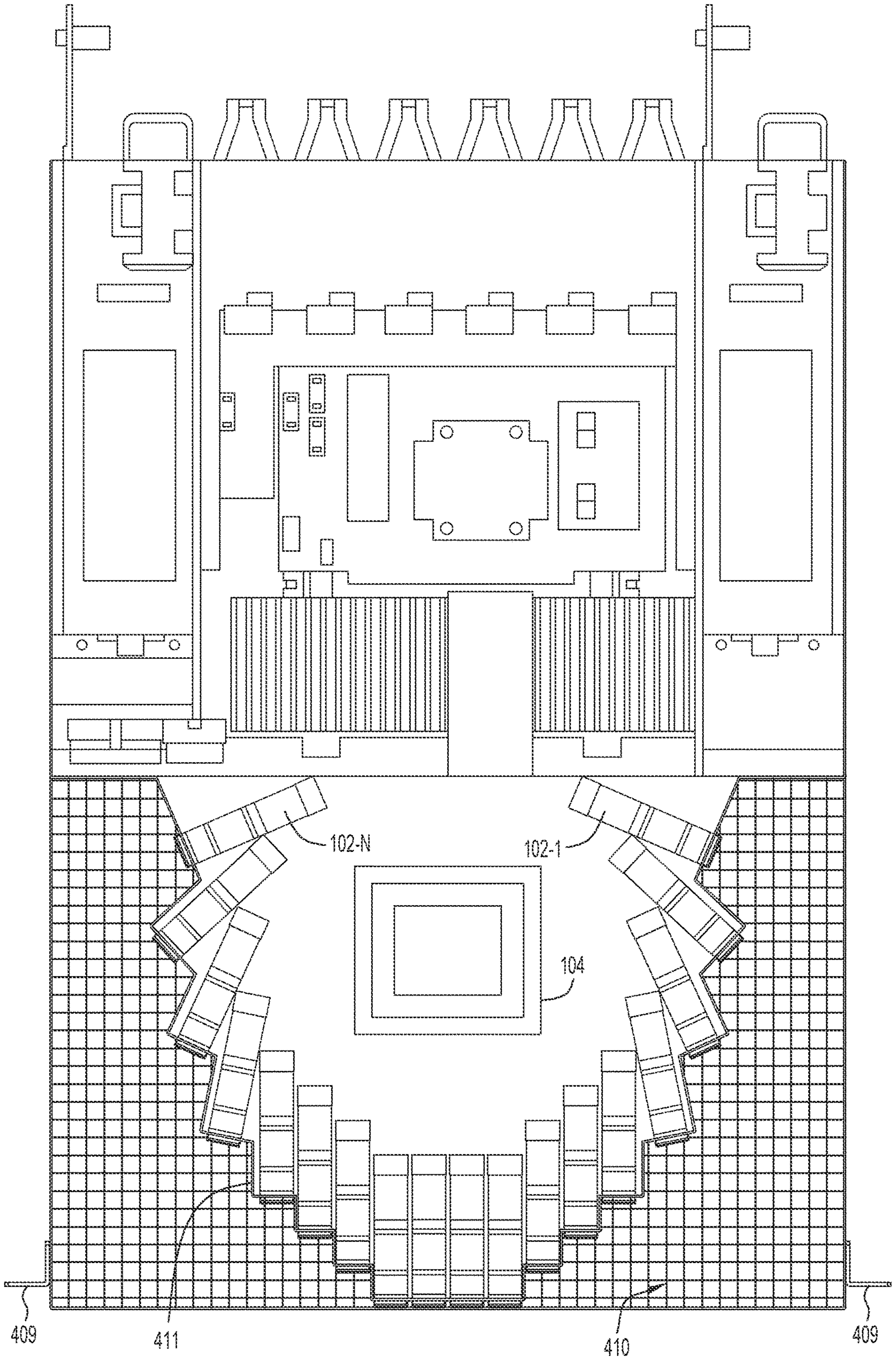
FIGS. 4C and 4D illustrate a variation based on the arrangement of FIG. 4B, with a non-flat front faceplate configuration and slide out fiber cable management, according to an example embodiment.

Reference is now made to FIG. 4C. FIG. 4C illustrates a variation of FIG. 4B with a non-flat or non-continuous front faceplate configuration and a cable management system. As illustrated in FIG. 4C, front faceplate 411 is installed along the outer sides/edges of the optical modules 102 to provide a non-flat or non-linear faceplate configuration. As further described below with respect to FIGS. 4E and 4F, the non-continuous faceplate configuration provides for increased air flow for the network device.

The configuration illustrated in FIG. 4C additionally includes screen mesh 410. Screen mesh 410 is a removable screen for cable management for cabling inside the traditional confines of a standard 1RU chassis. In one example, screen mesh 410 may be approximately ¼ inch square. In this example, cables leading to optical modules 102 may lay on the screen mesh 410 to keep the cables organized. FIG. 4C additionally includes rack mount ears 409 for mounting the assembly onto the rack. In the example illustrated in FIG. 4C, the chassis may slide out several inches to replace optical modules 102.

Figure 4D:
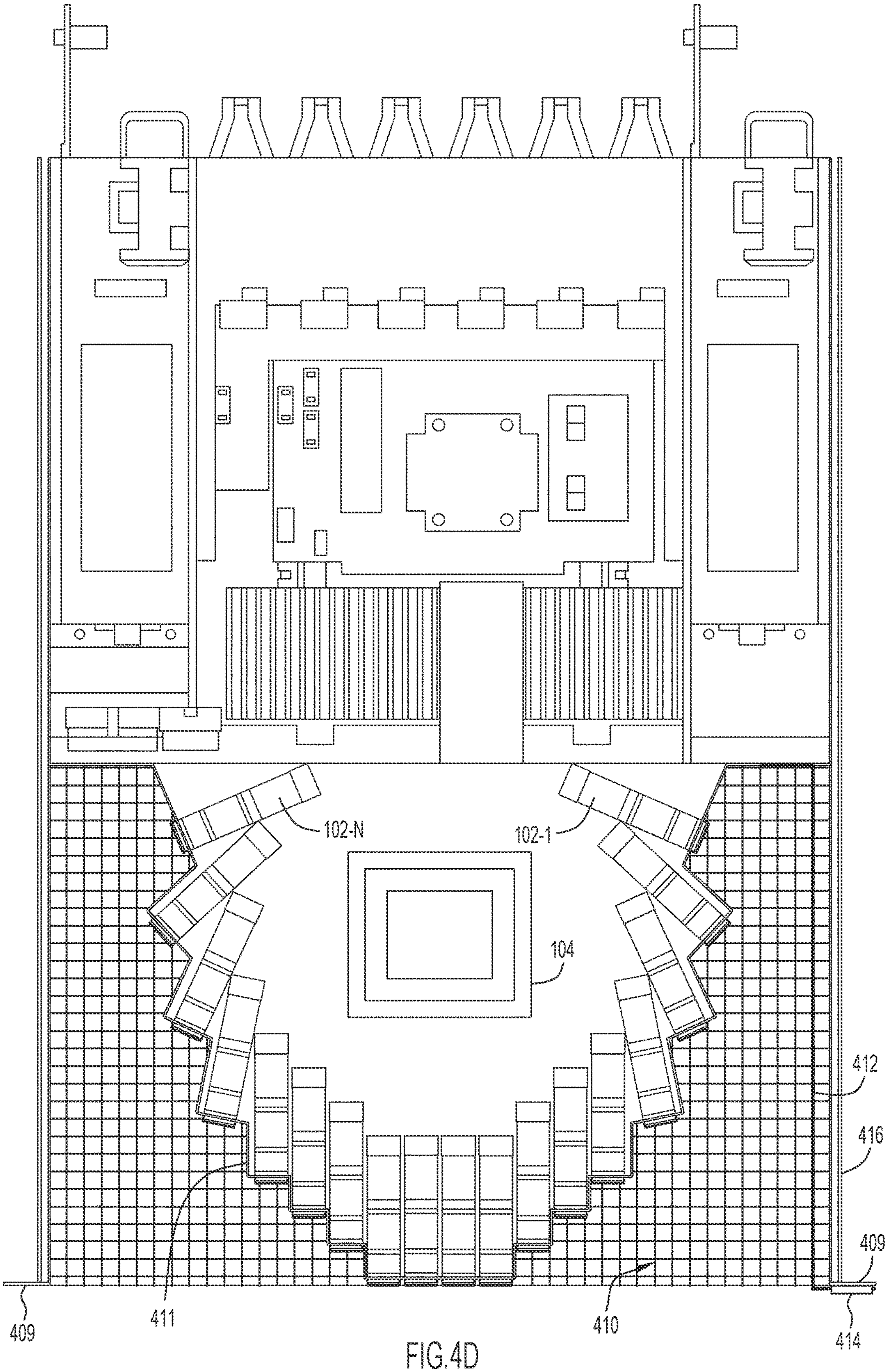

Reference is now made to FIG. 4D. FIG. 4D illustrates a variation based on the arrangement of FIG. 4C. The example illustrated in FIG. 4D illustrates a slide out rail system 416 to allow the printed circuit board 106 with the optical modules 102, ASIC 104, and screen mesh 410 to slide out of the assembly for replacement of an optical module 102. This example includes a ground wire 412 to rack mount ear 409 and a ground wire mount 414. The arrangements illustrated in FIGS. 4C and 4D may provide an open arrangement that makes it easier to replace optical modules.

Figure 4E:
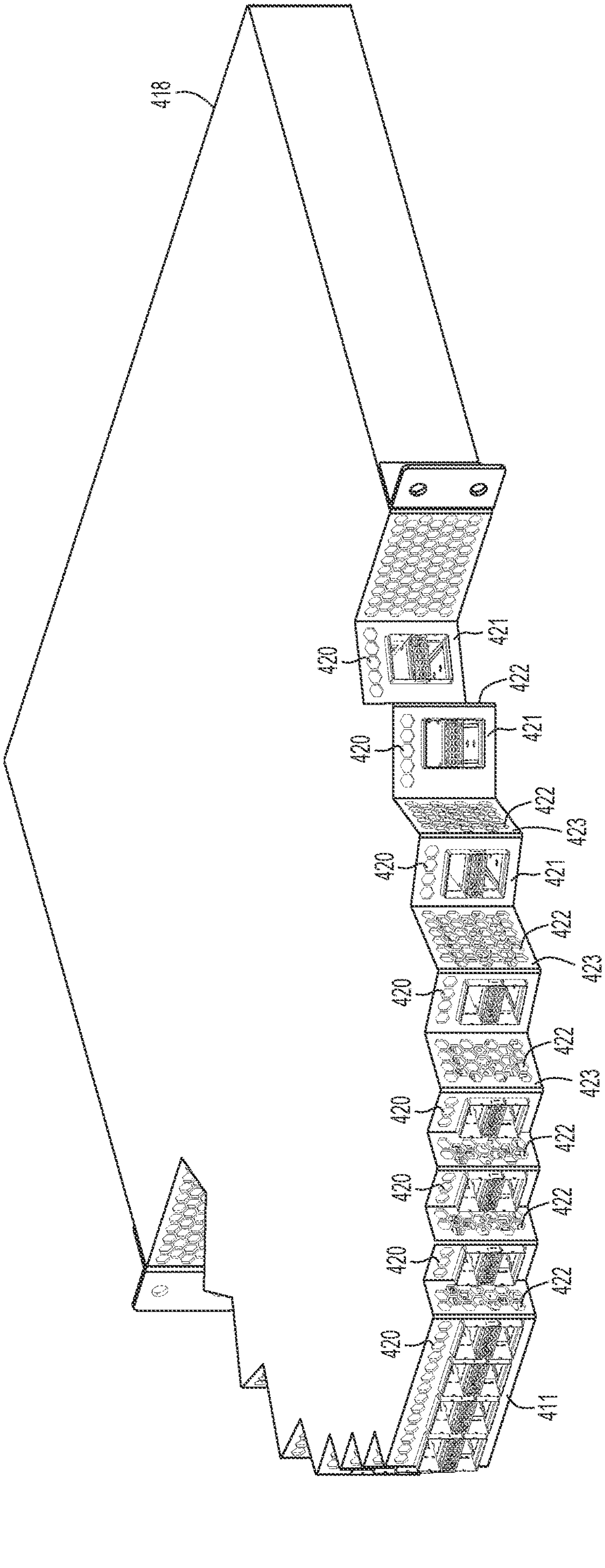
FIGS. 4E and 4F show a front perspective view of the variation shown in FIGS. 4C and 4D, where the number of openings can be increased by providing openings on the front faces and side faces of the faceplate, according to an example embodiment.

Reference is now made to FIG. 4E. FIG. 4E shows a front perspective view of the variation of a network device 418 shown in FIGS. 4C and 4D. FIG. 4E illustrates the front of faceplate 411 that follows or traces the outer edges of optical modules 102.

The faceplate 411 includes a plurality of faces or face portions that span along the front and sides of the optical modules 102. As illustrated in FIG. 4E, faceplate 411 includes multiple front face portions 421 that expose receptacles for the optical modules 102. The receptacles are exposed on the front face portions 421 to allow, for example, optical cables to plugged into the optical modules 102. The front face portions 421 are offset from adjacent front face portions 421. Side face portions 423 run along the side of optical modules 102 and connect front face portions 421 to adjacent front face portions 421. In other words, the faceplate 411 traces or outlines the outer edges of the optical modules 102 around the ASIC 104. Since the optical modules 102 are not in a straight line, the front face portions 421 of the optical modules are offset from one another. Since the faceplate 411 follows the outer edges of the optical modules 102, the faceplate 411 surrounds the ASIC 104 in a similar manner as the optical modules 102. The faceplate 411 includes a plurality of corners where side face portions 423 meet front face portions 421 around the ASIC 104.

By providing a faceplate 411 with this shape/configuration, the openings for inlet air can be increased using not only openings in the front facing walls of the front face portions 421, but also openings on the side facing walls of the side facing portions 423. As illustrated in FIG. 4E, front openings 420 provide air inlets to the front of the optical modules 102 and side openings 422 provide air inlets to the sides of optical modules 102. The air flow provided by the front openings 420 and the side openings 422 provides increased air flow compared to a standard flat faceplate design. The increased air flow provides for increased cooling of a network device without additional fans or other cooling systems. In addition, power to cooling fans may be reduced without loss of cooling due to the increased air flow provided by the additional air inlet in the non-linear faceplate configuration.

Figure 4F:
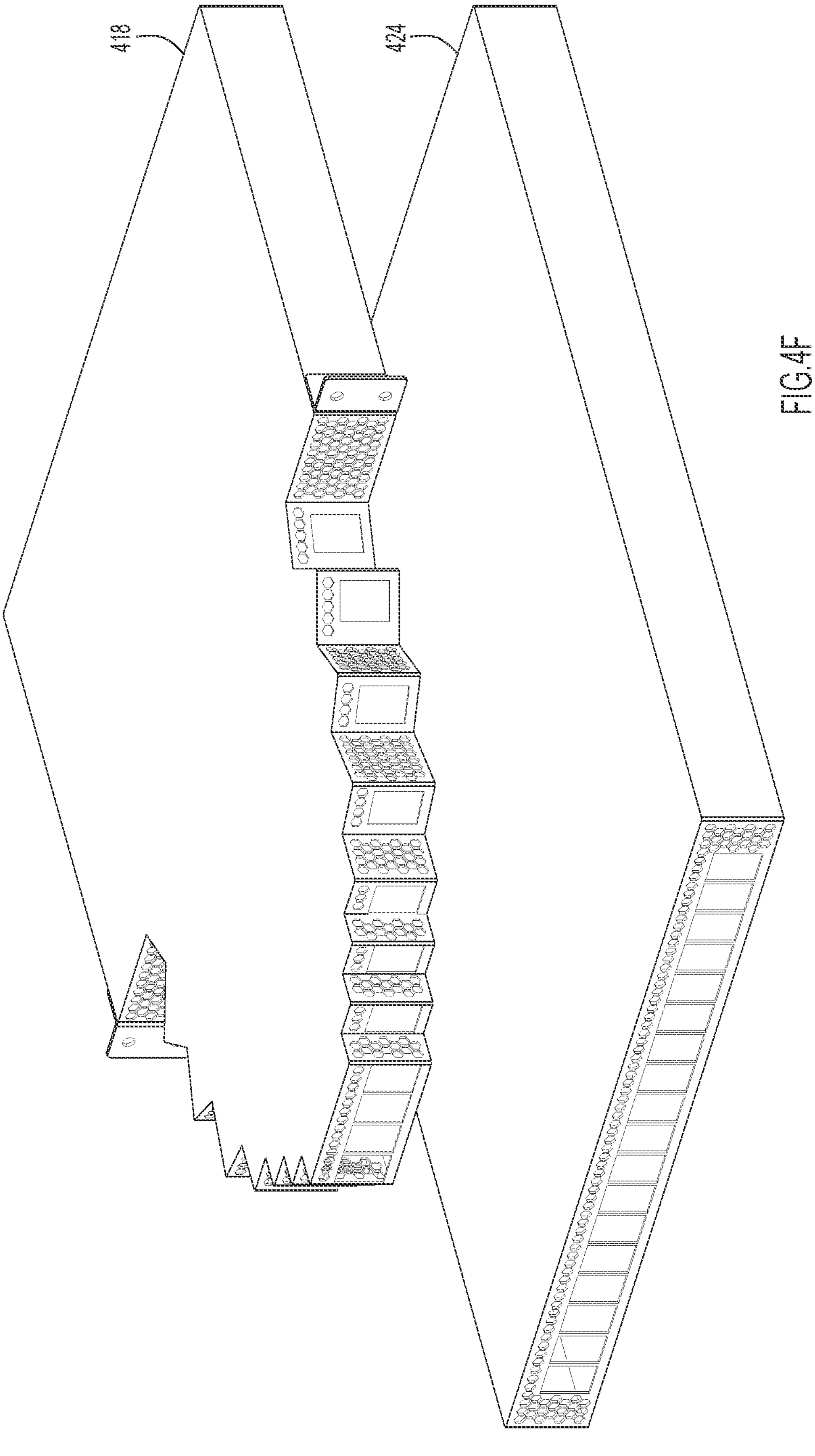

Reference is now made to FIG. 4F. FIG. 4F illustrates the increase airflow associated with a network device 418 with a non-flat or non-linear faceplate compared to a network device 424 with a flat or linear faceplate.

As illustrated in FIG. 4F, network device 424 with a standard flat faceplate has openings for air flow only in the front of the network device. The example network device 424 has 2550 square millimeters of grid opening space that allows for air inlet. In contract, network device 418 with a non-flat faceplate with grid openings on the front and the side faces has 13,000 square millimeters of grid opening space that allows for air inlet. Therefore, the non-flat faceplate has five times the amount of grid opening area compared with the standard flat faceplate design. By increasing the amount of grid openings, the air flow inside the network device may be increased while maintaining the same fan power. In addition, the air flow inside the network device may be maintained while the fan power consumption is reduced.

The arrangements shown in FIGS. 1-3 and 4A-4F may allow for 32 to 40 optical modules 102 to be arranged on a PCB 106 around an ASIC 104. In a full circle, it is possible to install 64 or more optical modules 102. These arrangements allow for the optical modules to be replaced while the network device is active. One distinguishing aspect of these arrangements is the reduced electrical distances using linear pluggable optics or standard optics to reduce total power, reduce ASIC die size, and reduce optical module size. Moreover, these arrangements allow for significantly more air flow when fans are used, because the front faceplate is where the LC bulkhead connections are made. This gives more air flow at cooler temperatures because the traditional front mount cages with higher power optical modules are not blocking the air at entry or increasing air temperature.

Reference is now made to FIGS. 5A-5H. FIGS. 5A-5H show an arrangement that allows for a less complex or fewer angle faceplate while still reducing electrical signal lengths.

Figure 5A:
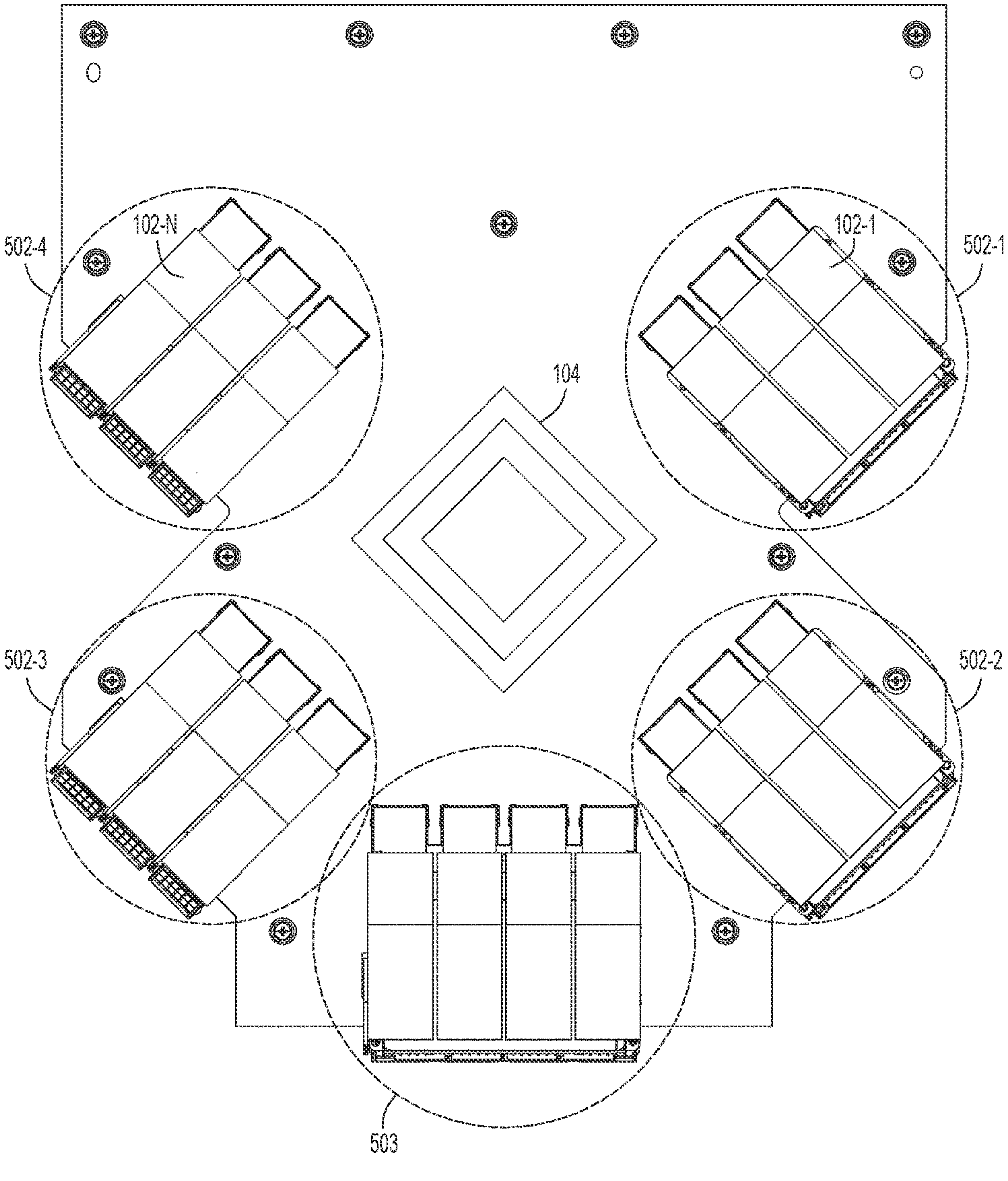
FIGS. 5A-5C show an arrangement that allows for a less angled approach to a non-flat front faceplate configuration, and a fixed flat fiber cable management method, according to an example embodiment.

FIG. 5A illustrates a full circle/diamond layout of optical modules 102 around an ASIC 104, with 2×3 optical modules 502-1, 502-2, 502-3, and 502-4 (e.g., Quad Small Form-factor Pluggable (QSFP)) on the right and left and 2×4 optical modules 503 on the front. In this example, the ASIC 104 has been turned or shifted and is a diamond shape with 2×N (where N is the number of optical modules in a row) optical modules on the sides and front. As described below with respect to FIG. 5D, this configuration allows for reduced electrical signal lengths while supporting 2×N optical module cooling provided by liquid cooling solutions.

Figure 5B:
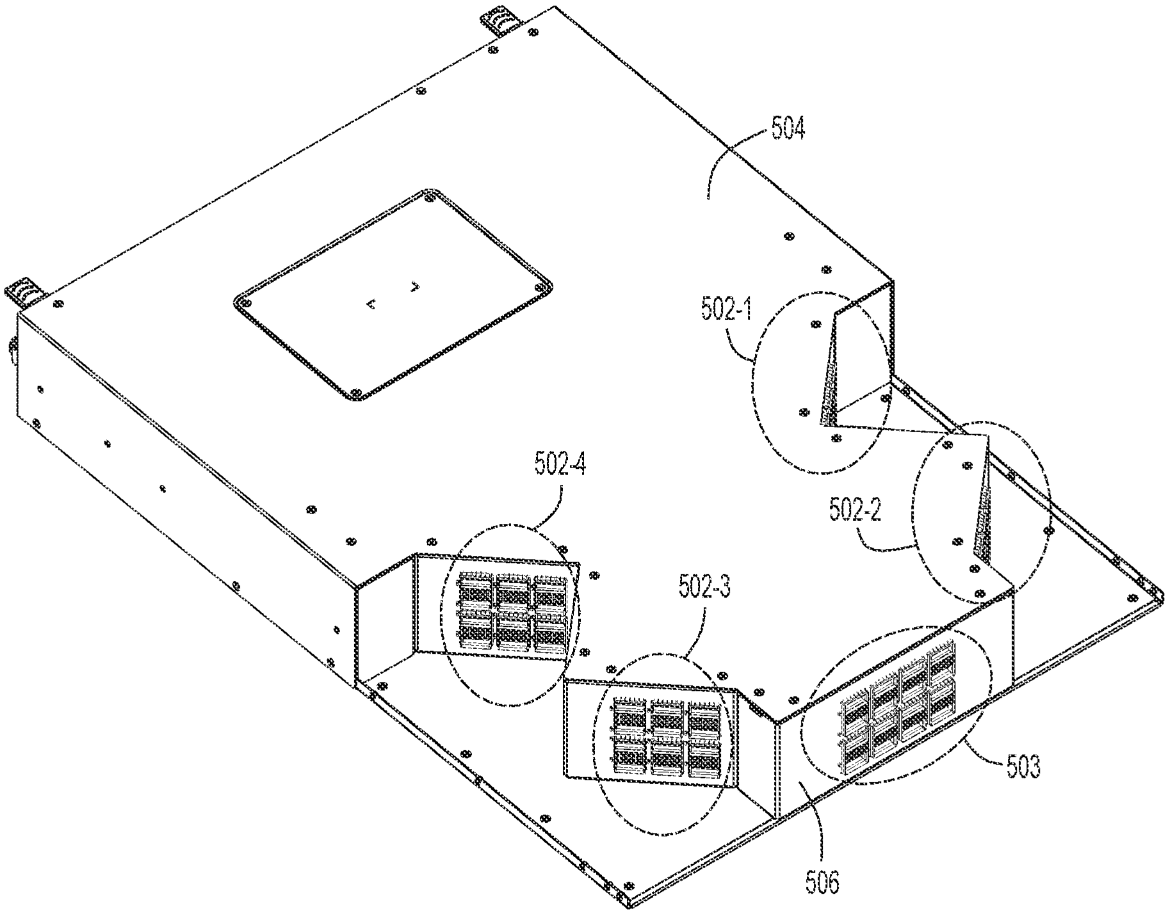

FIG. 5B shows a front perspective view of the variation of a network device 504 shown in FIG. 5A. As shown in FIG. 5B, the front faceplate 506 has multiple face portions that allow the optical modules 102 to be accessed while providing a network device with short electrical trace lengths. The face portions expose receptacles for the optical modules 102. As illustrated in FIG. 5B, the face portion associated with optical modules 502 runs along a horizontal plane along the front of the network device. In contrast, the face portions associated with optical modules 502-1 to 502-4 are positioned at an angle with respect to the horizontal plane. In addition, the angled face portions are offset from one another. For example, the face portion associated with optical modules 502-4 is offset from the face portion that is associated with the face portion associated with optical modules 502-3. The faceplate 506 substantially traces or outlines the outer edges of the optical modules. The faceplate 506 substantially surrounds the ASIC 104 and forms angles as the faceplate outlines the outer edges of the optical modules.

As illustrated in FIG. 5B, the maximum trace length for an optical module in this configuration is 2.5 inches. In addition, a PCB trace loss of 1 dB/inch or less can be achieved for this configuration using ultra-low loss PCB material. Instead of providing multiple air inlets on the faceplate 506, in one embodiment, as described below with respect to FIG. 5D, a network device using this configuration may be cooled using liquid cooling solutions.

Figure 5C:
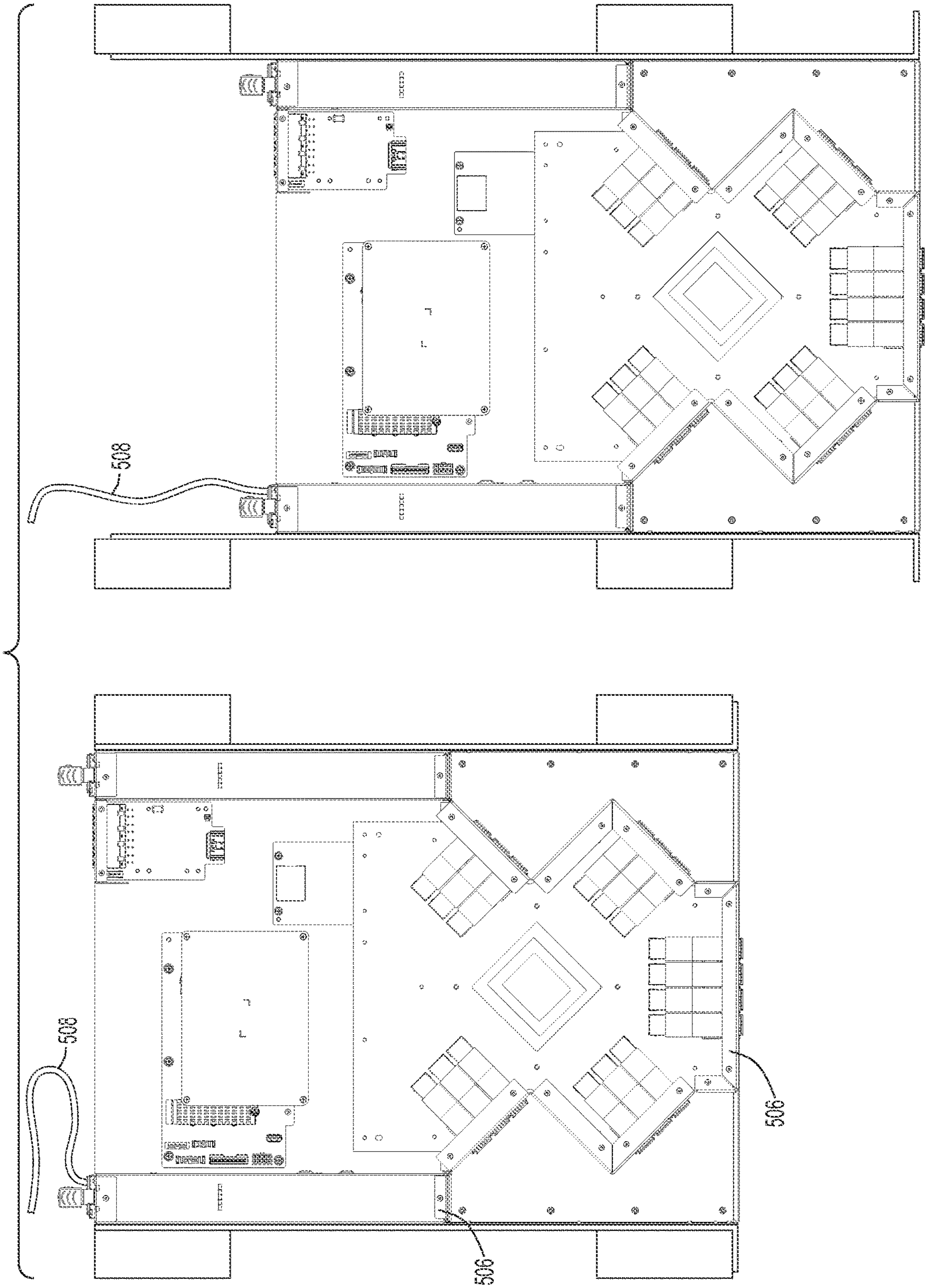

FIG. 5C illustrates the optical module assembly fully inserted into a rack and slid out from the rack. In this example, the PCB with optical modules and ASIC may be installed on a rail or sliding tray that allows the PCB to be slid out of a housing assembly. As shown at 508, the power cord and liquid manifold are extendable. In this way, the optical module assembly may be slid out to allow for replacement of an optical module 102 while the network device is active. In addition, the perimeter of the faceplate 506 allows the optics to stay outside of the enclosure.

Figure 5D:
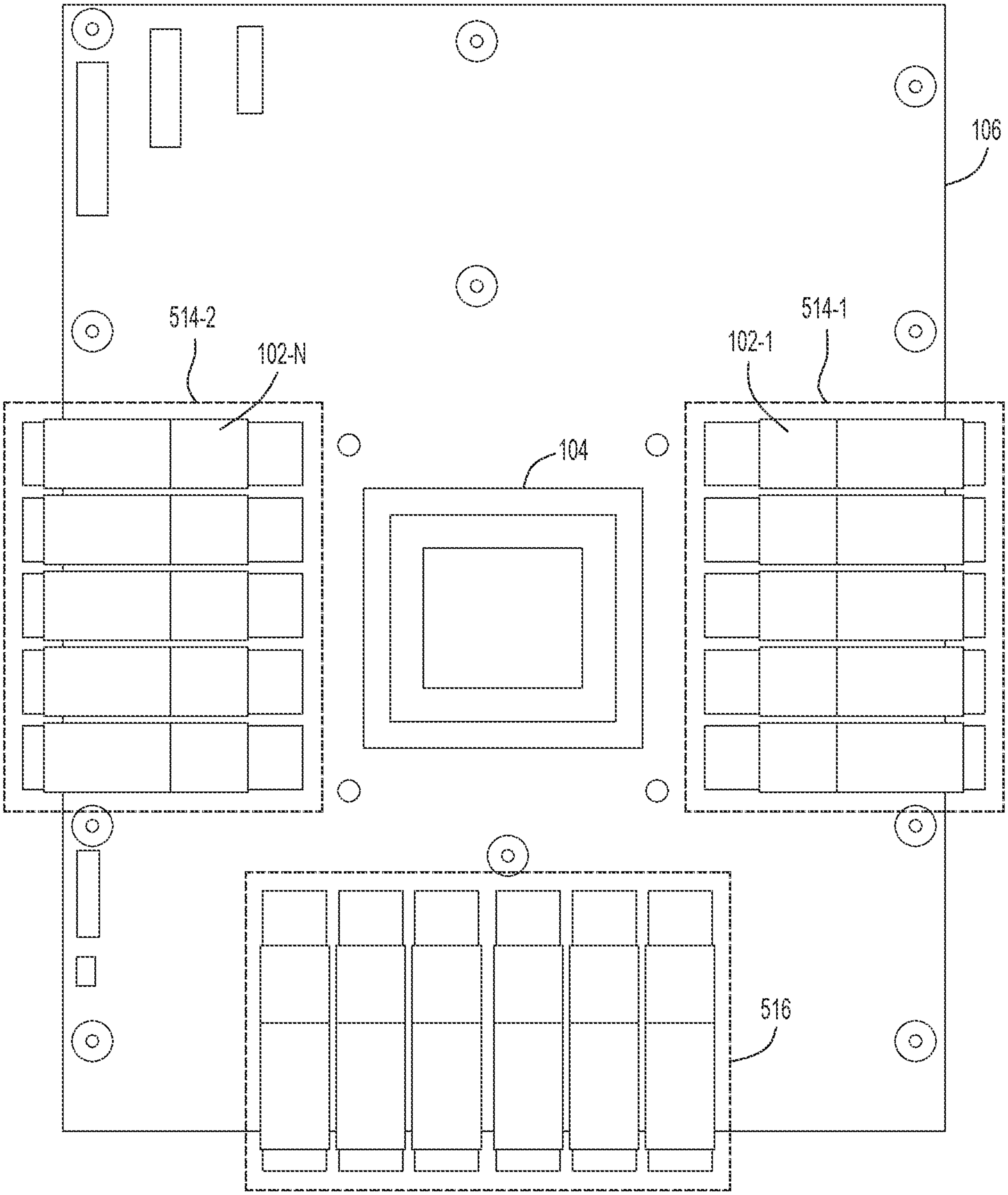
FIG. 5D illustrates a variation of the layout shown in FIG. 5A, with a rectangular arrangement of the optical modules around an ASIC, according to an example embodiment.

FIG. 5D illustrates another arrangement that may be cooled using liquid cooling solutions. FIG. 5D shows half-circle arrangement of optical modules 102 around an ASIC 104 on a PCB 106, with 2×5 optical cages 514-1 and 514-2 (e.g., QSFP 800 G) on the right and left, and 2×6 optical cages 516 on the front. The arrangement illustrated in FIG. 5D provides for short trace lengths between the optical modules 102 and the ASIC 104 and may be cooled using liquid cooling. In addition, the PCB 106 may be installed on a tray or rail that may slide out as described above for replacement of the optical modules 102 while a network device is active. In the configuration illustrated in FIG. 5E, a maximum trace length for the traces between the optical modules 102 and the ASIC 104 is 2.5 inches. In addition, a PCB trace loss of 1 dB/inch or less may be achieved using ultra-low loss PCB material.

Figure 5E:
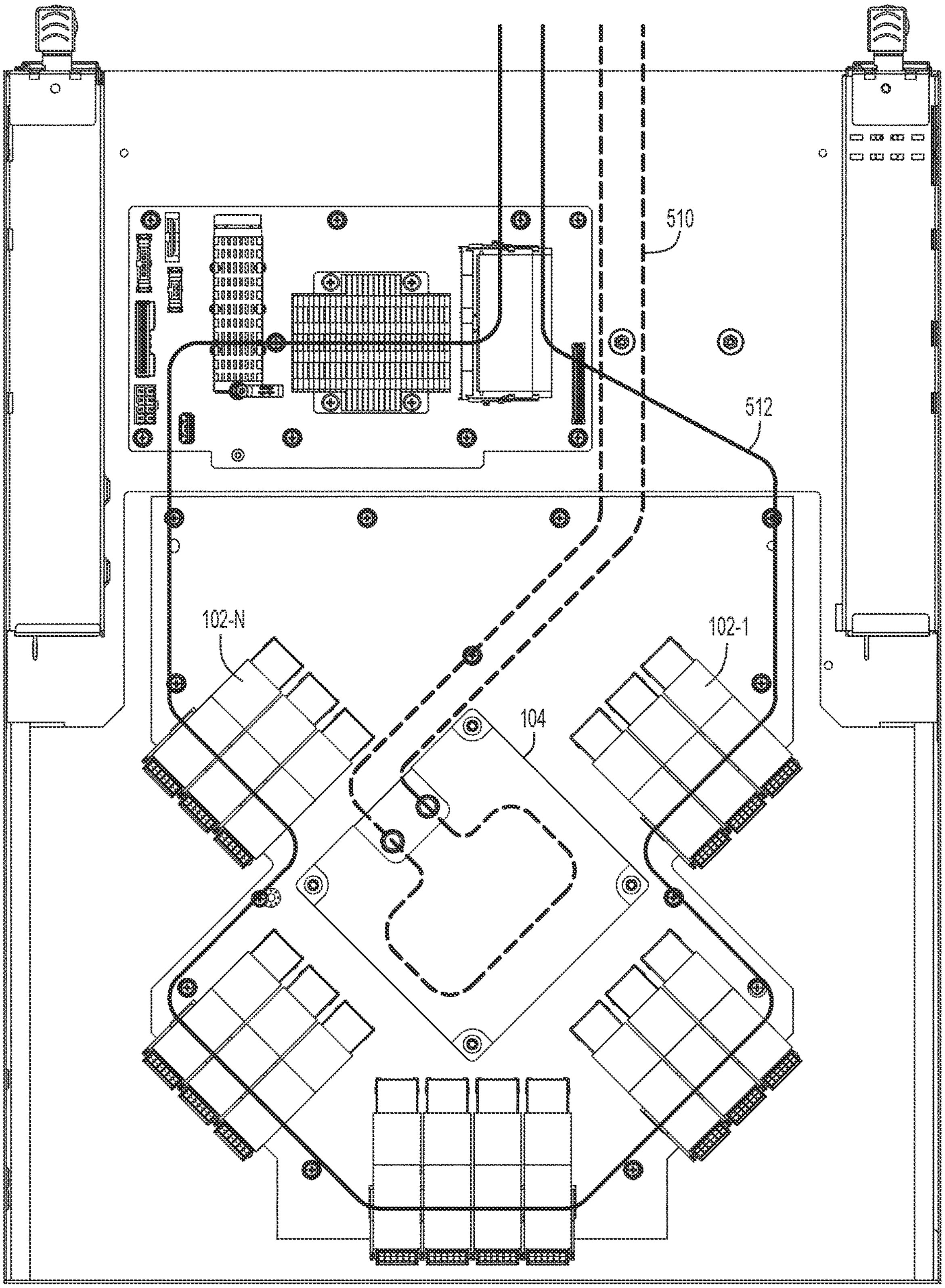
FIG. 5E illustrates a variation of the layout shown in FIG. 5A that includes a liquid cooling system, according to an example embodiment.
Figure 5F:
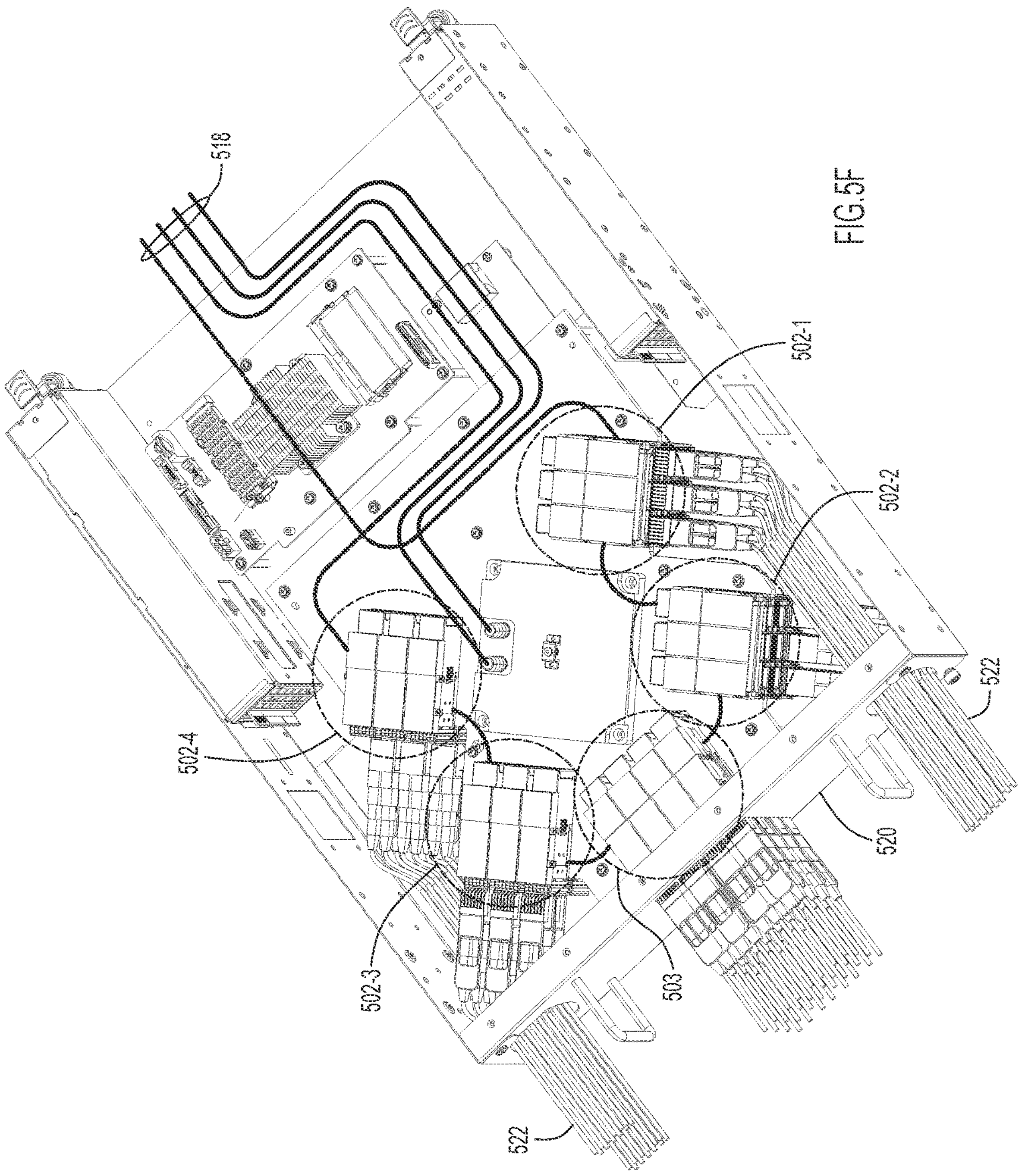
FIG. 5F illustrates a variation of the layout shown in FIG. 5A with liquid cooling tubing in a collapsed form, according to an example embodiment.
Figure 5G:
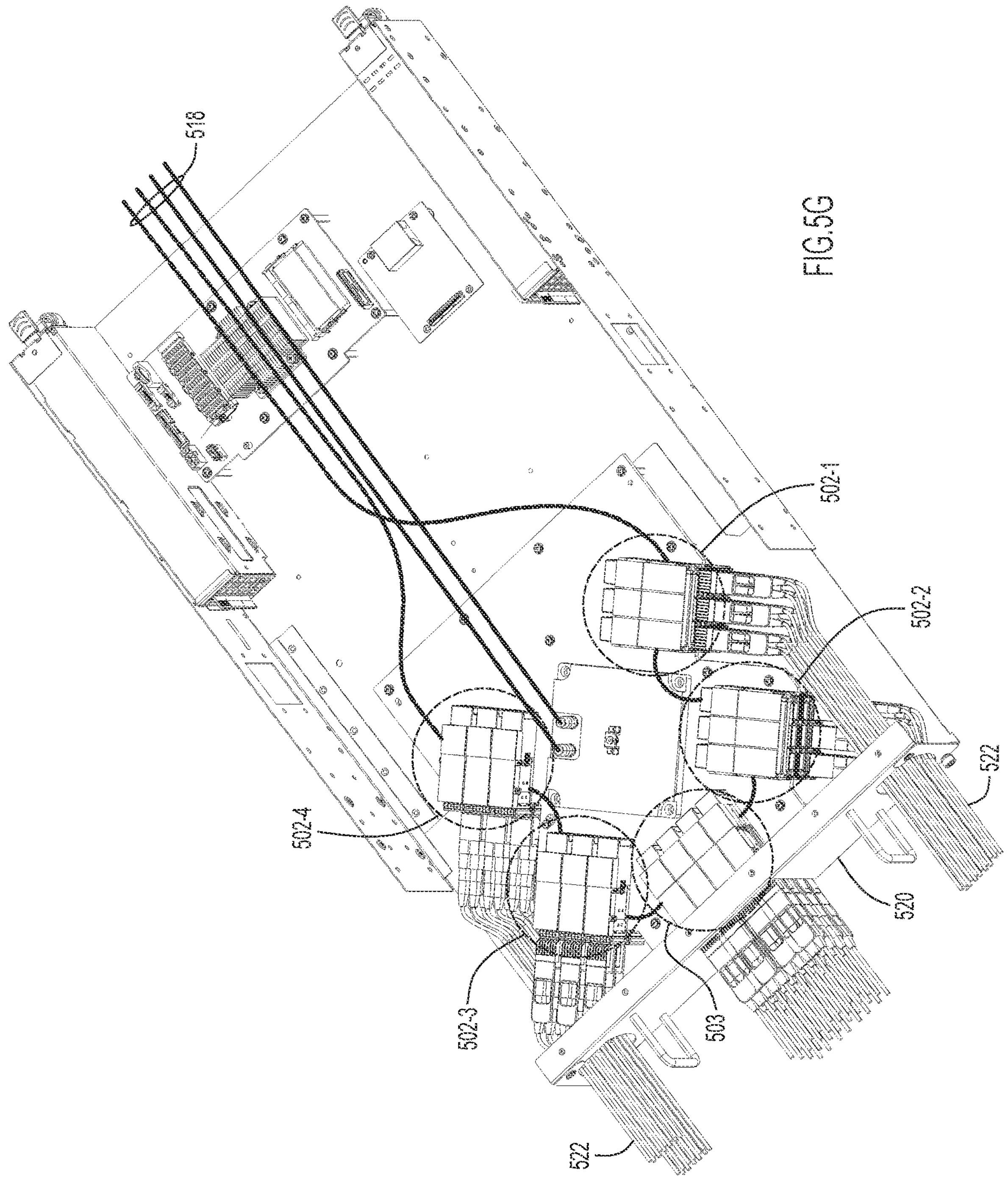
FIG. 5G illustrates a variation of the layout shown in FIG. 5A with liquid cooling tubing in an extended form, according to an example embodiment.

FIGS. 5E-5G illustrate embodiments in which liquid cooling solutions may be used for cooling the network device. In many next-generation network devices, the three highest power-consuming areas are input/output (I/O) modules, network processing units (NPUs), and fan modules. Combined, these areas account for approximately 85% of the entire system's power. For example, in a 51.2 T router with 64 ports of QSFPDD 800G, the I/O power represents about 900 W, the NPU about 800 W, and the fan power about 700 W when the total system power is approximately 2.7 kW. In some embodiments, liquid cooling may be used to replace the fan modules.

FIG. 5E illustrates single phase cool loops that may be used to cool a network device with the configuration illustrated in FIGS. 5A-5D. As illustrated in FIG. 5E, a first liquid cool loop 510 may be used to cool the ASIC 104 and a second liquid cool loop 512 may be used to cool the optical modules 102. The configuration illustrated in FIGS. 5A-5D may additionally allow for a cold plate that can support 2×N cooling from liquid cooling solutions. In this liquid cooling solution, the fans may be removed from a network device and the cooling may be supplied by cold plates. Additional loops may be provided for cooling the CPU, main processing unit (MPU), and other components of the network device. The short trace lengths allow for lower power consumption than if the trace lengths are longer (due to the elimination of retimers and high power serdes in the design). Therefore, the combination of the shorter trace lengths and the liquid cooling provide enough cooling to prevent a network device utilizing this configuration from overheating.

Figure 5H:
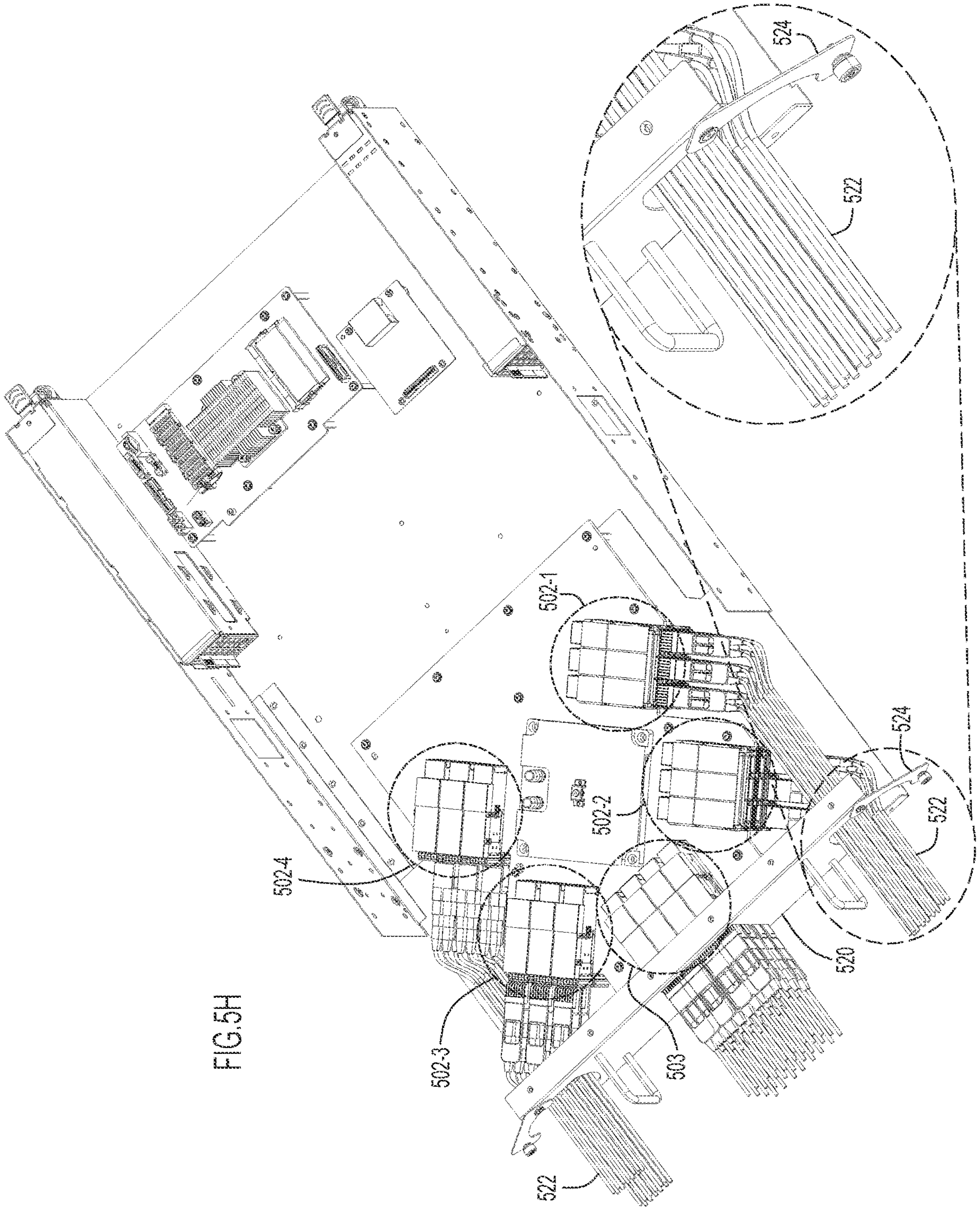
FIG. 5H illustrates a variation of the layout shown in FIG. 5A with cables extending through a faceplate, according to an example embodiment.

FIGS. 5F-5H illustrates arrangements in which liquid cooling tubes may be used to cool a network device with the configuration illustrated in FIG. 5A. In the example illustrated in FIGS. 5F-5H, instead of providing a non-linear faceplate (as illustrated in FIG. 5B), the faceplate 520 is flat and some optical cables 522 extend through the faceplate 520 through an opening in the faceplate 520. In these examples, optical modules 502-1 to 502-4 are housed inside the system enclosure and optical modules 503 are situated on the faceplate 520. In these examples, to replace or service optical modules 502-1 to 502-4, the PCB 106 can be extended from or retracted into the system enclosure.

For example, similar to the examples described above with respect to FIGS. 4A-4D and 5C, PCB 106 may be installed on a chassis or motherboard positioned on a rail or slide, which allows for smooth movement during opening and closing procedures. In all embodiments described herein, the mechanism may be operated either with an electric motor or manually and a hard stop may be provided at the maximum extension to prevent further movement. The chassis may extend just enough to allow a user to access internal optics (e.g., optical modules 502-1 to 502-4) without the need to shut down the network device.

FIG. 5F illustrates an example in which PCB 106 with ASIC 104 and optical modules 502-1 to 502-4 and optical modules 503 are retracted into the housing assembly. As illustrated in FIG. 5F, liquid cooling tubing 518 is in a collapsed form with an access length. The liquid cooling tubing 518 may be used to cool optical modules 502-1 to 502-4 and 502, ASIC 104, and other components of a network device. The tubes of the liquid cooling tubing 518 are flexible and can bend and straighten based on whether the chassis is in the housing assembly or extended out of the housing assembly. When the PCB 106 is retracted into the housing assembly, the tubes of the liquid cooling tubing 518 are slack. For example, as shown in FIG. 5F, liquid cooling tubing 518 extends around the components behind PCB 106.

FIG. 5G illustrates an example in which PCB 106 is extended from the housing assembly. As illustrated, in this example, liquid cooling tubing 518 is straightened as the chassis is slid out of the housing assembly. The liquid cooling tubing 518 becomes tauter as the PCB 106 is extended from the housing assembly. The liquid cooling tubing 518 may be long enough to extend far enough to cool the components without breaking when the PCB 106 is extended to the maximum extension.

FIG. 5H illustrates a mechanism in which the optical cables 522 for the internal optical modules 502-1 to 502-4 may extend through faceplate 520. As illustrated in FIG. 5H, the optical cables 522 for optical modules 502-1 and 502-2 may extend through a first opening in faceplate 520 on a first side of the faceplate 520 and the optical cables 522 for optical modules 502-3 and 502-4 may extend through a second opening in faceplate 520 on a second side of faceplate 520. A hinged component 524 may be used to secure the optical cables 522 in the openings. For example, the hinged component 524 may extend up and down (or open and close) to secure the optical cables 522 based on the size of the fiber trunk. In some embodiments, the optical cables 522 may extend through slots in faceplate 520 (not illustrated in FIG. 5H). In some embodiments, different sets of optical cables 522 may extend through different slots in faceplate 520. For example, top optical cables may pass through a first slot and bottom optical cables may pass through a second slot for board-to-board optics.

Figure 6A:
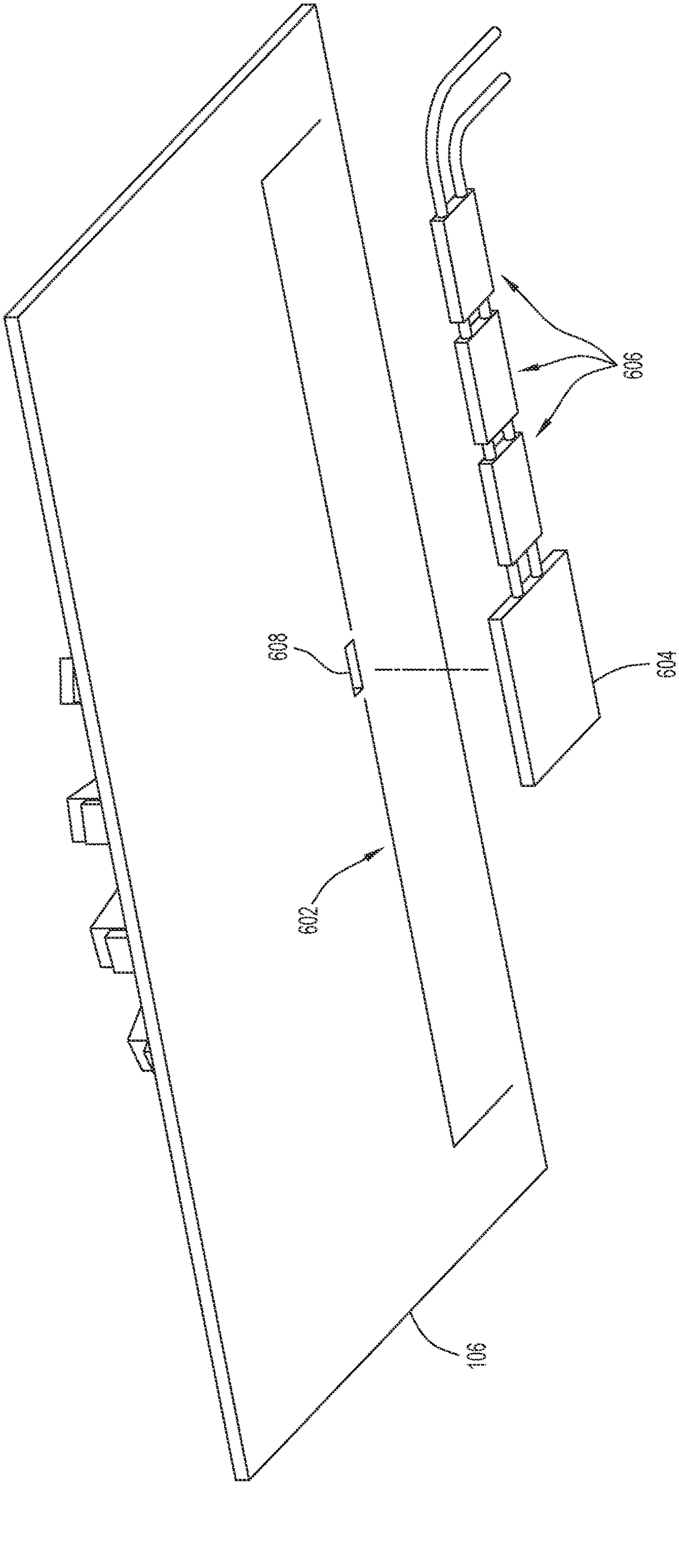
FIGS. 6A and 6B show bottom and top views respectively of optical module arrangement around an ASIC and illustrating power delivery to the ASIC, according to an example embodiment.
Figure 6B:
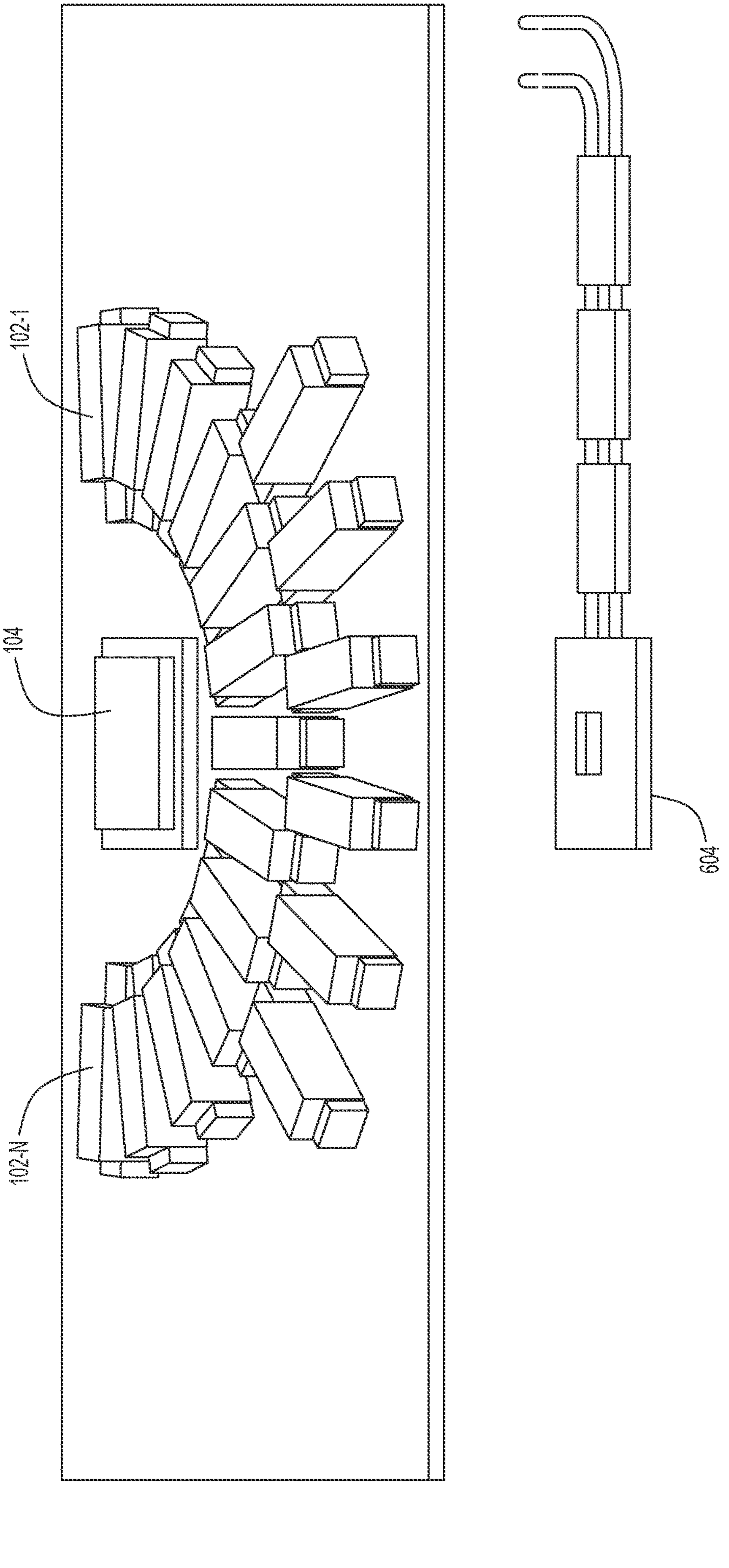

Reference is now made to FIGS. 6A and 6B. FIG. 6A shows a bottom view in which a power plug mini PCB concept is used to deliver power into the ASIC core and serdes. FIG. 6A includes PCB 106, bus bar 602, power plug 604, and POL 606. FIG. 6B shows a top view of the arrangement shown in FIG. 6B. FIG. 6B includes optical modules that surround ASIC 104 on the top of PCB 106 and plug 604 that plugs into ASIC 104 on the bottom of PCB 106.

As illustrated in FIG. 6A, power plug 604 may be mounted on or into the bottom of PCB 106 (e.g., on an opposite side of PCB 106 from optical modules 102 and ASIC 104). Power plug 604 may be plugged into an opening 608 in the bottom of PCB 106 to supply power to ASIC 104. POL 606 may be integrated into the bus bar 602 on the bottom of PCB 106. When using the mini power plug 604, power to the optical modules 102 still may be supplied via the primary PCB power distribution (e.g., PSU 208 or PSU 212 of FIG. 2). However, a smaller power plug version may also be used to transport power to the optical modules 102 without the need to use the primary PCB power distribution. This allows the primary circuit board, in all cases above, to only use trace routing of the high-speed signals and other CPU/control signals.

By delivering the power to the ASIC 104 from underneath the PCB 106, the PCB 106 may have substantially less copper and the total number of layers/thickness of PCB 106 may be reduced. For example, the number of power layers required for the PCB 106 may be reduced from 12 to two. By implementing embodiments described herein to use linear optics, reduce the power, and reduce the trace lengths, the number transmit layers and the number of receive layers required for PCB 106 may be cut in half. By adding the mini power plug 604, the total number of layers required to manufacture PCB 106 may be reduced even more. In some examples, by implementing the embodiments described herein, the thickness of PCB 106 may be reduced from 220 mils to 93 mils and a total number of layers of PCB 106 may be reduced from 36-40 to 22-24.

In addition to reducing the thickness of the PCB 106, a cost associated with manufacturing a network device using the techniques described herein is dramatically lowered. By reconfiguring the arrangement of the ASIC 104 and optical modules 102 and providing power to the ASIC 104 using the mini power plug 604, cost savings may be experienced due to the elimination of retimers and high-power serdes, reduced power required to perform cooling, and a reduced size of the PCB 106.

Figure 7:
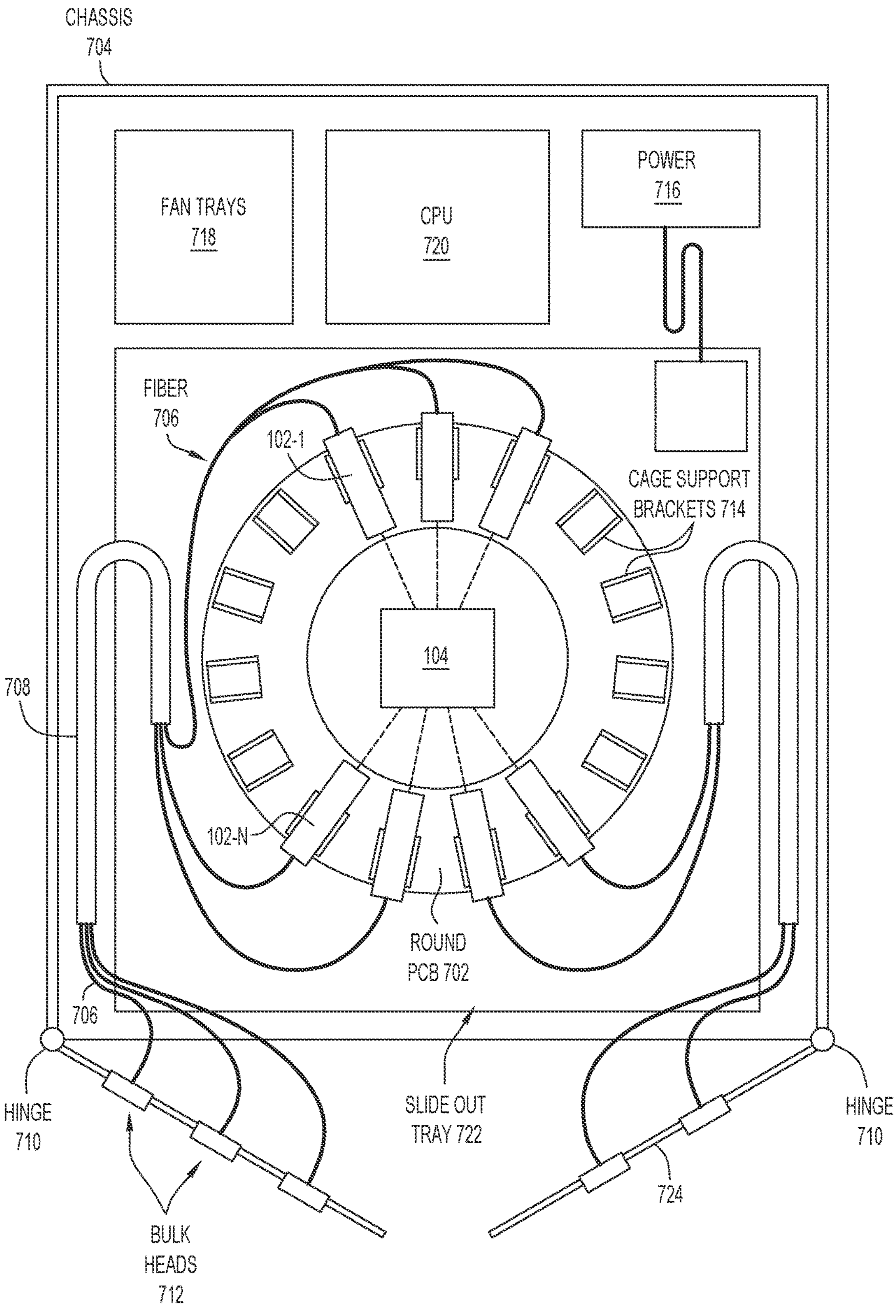
FIG. 7 illustrates an example of a fully circular circuit board with a plurality of linear optic pluggable modules arranged around an ASIC, according to an example embodiment.

Reference is now made to FIG. 7. FIG. 7 illustrates an example of a full 360-degree (fully circular) PCB 702 with a plurality of linear optic pluggable modules/optical modules 102 arranged around an ASIC 104, using a slide out tray.

The optical modules 102 may be installed on the PCB 702 using cage support brackets 714. The 1RU/2RU chassis 704 that houses PCB 702 may slide out about 40% of the way and the top cover lifted for access to replace the pluggable modules. For example, the PCB 702 may be installed on a slide out tray 722. A front faceplate 724 may open to the left and to the right using hinges 710 so that the entire PCB 702 unit may be pulled out of a housing assembly (e.g., for replacement of an optical module 102). Front faceplate 724 includes optical bulkhead connectors 712 that connect to optical patch cables/fibers 706. Cable management system 708 may be used to manage the cables/fibers 706 to prevent the cables/fibers 706 from becoming tangled or messy when the PCB 702 is pulled out of the assembly. For example, cable management system 708 may include optical loops on each side of PCB 106 that grow and shorten based on whether the PCB 702 is pulled out of the assembly.

The CPU controls for ASIC 104, such as fan trays 718, CPU 720, and power 716, are located behind the PCB 702. In addition, power cables and CPU cables (not illustrated in FIG. 7) connect underneath the ASIC 104 so the doors on the faceplate 724 can be opened, PCB 702 can be slid out, an optics module 102 can be changed, PCB 702 can be pushed back into the assembly, and the door can be closed. By arranging the optical modules 102 around the ASIC 104 in a circular arrangement, 64 or more optical modules 102 may be installed on PCB 702. PCB 702 may slide out far enough so that optical modules 102 in the back of ASIC 104 may be replaced while the network device is active. In addition, the arrangements provide for short trace lengths between the optical modules 102 and the ASIC 104, which provides the benefits described above of lower power consumption and cost.

Figure 8:
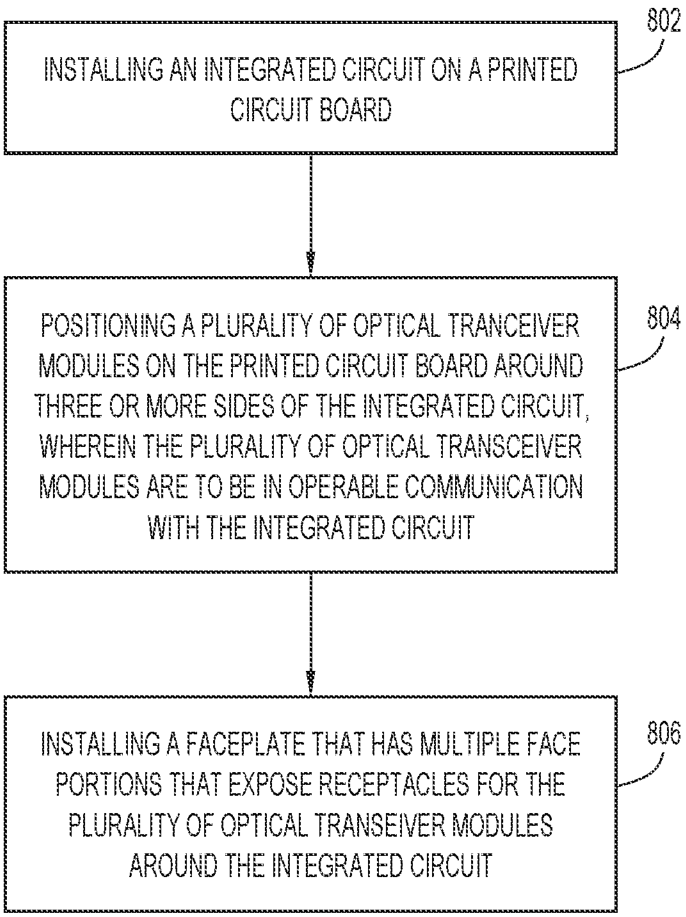
FIG. 8 is a flow diagram illustrating a method of creating a device with short signal traces, reduced power consumption, and improved cooling, according to an example embodiment.

Reference is now made to FIG. 8. FIG. 8 is a flow diagram illustrating a method of creating a device with short signal traces, reduced power consumption, and improved cooling.

At 802, an integrated circuit is installed on a printed circuit board. At 804, a plurality of optical transceivers are installed on the printed circuit board around three or more sides of the integrated circuit. The plurality of optical transceiver modules are to be in operable communication with the integrated circuit. For example, the plurality of optical transceiver modules may be positioned in a semi-circle, a circle, or a diamond shape around the integrated circuit.

At 806, a faceplate is installed. The faceplate has multiple face portions that expose receptacles for the plurality of optical transceiver modules around the integrated circuit.

In summary, arrangements are presented herein for using linear optic pluggable modules with traditional optical cages in shorter distances and repeatable routing to an ASIC. It should be noted that shorter high speed signal traces and similar signal group routing patterns from the ASIC to the optical cage electrical assembly result in less bit errors or block code errors. In addition, techniques described herein allow for forced air cooling or liquid cooling and support ASIC power delivery significantly beyond 2000 watts.

In one form, a device is provided that includes a printed circuit board; an integrated circuit that is installed on the printed circuit board; a plurality of optical transceiver modules positioned on the printed circuit board around three or more sides of the integrated circuit, and which are to be in operable communication with the integrated circuit; and a faceplate that has multiple face portions that expose receptacles for the plurality of optical transceiver modules around the integrated circuit.

In one example, the plurality of optical transceiver modules are positioned on the printed circuit board in a circular arrangement around the integrated circuit. In another example, each of the plurality of optical transceiver modules is positioned at approximately a same distance from the integrated circuit. In another example, the multiple face portions include front face portions and side face portions, wherein each front face portion is offset from each adjacent front face portion, and wherein a side face portion connects a front face portion to an adjacent front face portion. In another example, at least some of the multiple face portions are positioned at an angle with respect to a horizontal plane along a front of the device. In another example, the multiple face portions include air inlet openings in a front facing wall and in a side facing wall to provide air flow to at least one of the plurality of optical transceiver modules.

In another example, the device further includes a housing assembly that includes a chassis that is configured to slide into and out of the housing assembly, wherein the printed circuit board is installed on the chassis. In another example, the device further includes a plurality of liquid cooling tubes, wherein the plurality of liquid cooling tubes extend when the chassis is slid out of the housing assembly. In another example, the device further includes a mesh screen provided on the printed circuit board and configured to provide cable management for cables connected to the receptacles. In another example, the device further includes a power supply that is mounted on or into the printed circuit board on an opposite side of the printed circuit board from the integrated circuit and the plurality of optical transceiver modules.

In another form, a method is provided comprising installing an integrated circuit on a printed circuit board; positioning a plurality of optical transceiver modules on the printed circuit board around three or more sides of the integrated circuit, wherein the plurality of optical transceiver modules are to be in operable communication with the integrated circuit; and installing a faceplate that has multiple face portions that expose receptacles for the plurality of optical transceiver modules around the integrated circuit.

In yet another form, a device is provided including an integrated circuit that is installed on a printed circuit board; a plurality of optical transceiver modules positioned on the printed circuit board around three or more sides of the integrated circuit, wherein the plurality of optical transceiver modules are in operable communication with the integrated circuit; and a non-linear faceplate installed around outer edges of the plurality of optical transceiver modules around the integrated circuit, wherein the non-linear faceplate includes openings for receptacles for the plurality of optical transceiver modules.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of and' one or more of can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A device comprising:

a printed circuit board;

an integrated circuit that is installed on the printed circuit board;

a plurality of optical transceiver modules positioned on the printed circuit board around three or more sides of the integrated circuit, and which are to be in operable communication with the integrated circuit;

a faceplate that has multiple face portions that expose receptacles for the plurality of optical transceiver modules around the integrated circuit; and a power supply that is mounted on or into the printed circuit board on an opposite side of the printed circuit board from the integrated circuit and the plurality of optical transceiver modules.

2. The device of claim 1, wherein the plurality of optical transceiver modules are positioned on the printed circuit board in a circular arrangement around the integrated circuit.

3. The device of claim 1, wherein each of the plurality of optical transceiver modules is positioned at approximately a same distance from the integrated circuit.

4. The device of claim 1, wherein the multiple face portions include front face portions and side face portions, wherein each front face portion is offset from each adjacent front face portion, and wherein a side face portion connects a front face portion to an adjacent front face portion.

5. The device of claim 1, wherein at least some of the multiple face portions are positioned at an angle with respect to a horizontal plane along a front of the device.

6. The device of claim 1, wherein the multiple face portions include air inlet openings in a front facing wall and in a side facing wall to provide air flow to at least one of the plurality of optical transceiver modules.

7. The device of claim 1, further comprising a housing assembly that includes a chassis that is configured to slide into and out of the housing assembly, wherein the printed circuit board is installed on the chassis.

8. The device of claim 7, further comprising a plurality of liquid cooling tubes, wherein the plurality of liquid cooling tubes extend when the chassis is slid out of the housing assembly.

9. The device of claim 1, further comprising a mesh screen provided on the printed circuit board, wherein, when cables are connected to the receptacles, the cables are placed on the mesh screen and the mesh screen is configured to provide cable management for the cables connected to the receptacles.

10. A method comprising:

installing an integrated circuit on a printed circuit board;

positioning a plurality of optical transceiver modules on the printed circuit board around three or more sides of the integrated circuit, wherein the plurality of optical transceiver modules are to be in operable communication with the integrated circuit;

installing a faceplate that has multiple face portions that expose receptacles for the plurality of optical transceiver modules around the integrated circuit; and mounting a power supply on or into the printed circuit board on an opposite side of the printed circuit board from the integrated circuit and the plurality of optical transceiver modules.

11. The method of claim 10, wherein the plurality of optical transceiver modules are positioned on the printed circuit board in a circular arrangement around the integrated circuit.

12. The method of claim 10, wherein each of the plurality of optical transceiver modules is positioned at approximately a same distance from the integrated circuit.

13. The method of claim 10, wherein the multiple face portions include front face portion and side face portions, wherein each front face portion is offset from each adjacent front face portion, and wherein a side face portion connects a front face portion to an adjacent front face portion.

14. The method of claim 10, wherein at least some of the multiple face portions are positioned on an angle with respect to a horizontal plane along a front of the faceplate.

15. The method of claim 10, wherein the multiple face portions include air inlet openings in a front facing wall and in a side facing wall to provide air flow to at least one of the plurality of optical transceiver modules.

16. A device comprising:

an integrated circuit that is installed on a printed circuit board;

a plurality of optical transceiver modules positioned on the printed circuit board around three or more sides of the integrated circuit, wherein the plurality of optical transceiver modules are in operable communication with the integrated circuit;

a non-linear faceplate installed around outer edges of the plurality of optical transceiver modules around the integrated circuit, wherein the non-linear faceplate includes openings for receptacles for the plurality of optical transceiver modules; and a power supply that is mounted on or into the printed circuit board on an opposite side of the printed circuit board from the integrated circuit and the plurality of optical transceiver modules.

17. The device of claim 16, wherein the non-linear faceplate includes a plurality of face portions, and wherein at least some of the plurality of face portions are positioned at an angle with respect to a horizontal plane along a front of the device.

18. The device of claim 16, wherein the non-linear faceplate includes air inlet openings in a front facing wall and in a side facing wall to provide air flow to at least one of the plurality of optical transceiver modules.

19. The device of claim 16, further comprising a mesh screen, wherein, when cables are connected to the receptacles, the cables are placed on the mesh screen and the mesh screen is configured to provide cable management for cables connected to the receptacles.

20. The device of claim 16, further comprising a housing assembly that includes a chassis that is configured to slide into and out of the housing assembly, wherein the printed circuit board is installed on the chassis.

* * * * *